US00RE35313E

United States Patent [19]

Hori et al.

[11] E Patent Number: Re. 35,313

[45] Reissued Date of Patent: Aug. 13, 1996

[54] SEMICONDUCTOR INTEGRATED CIRCUIT WITH VOLTAGE LIMITER HAVING DIFFERENT OUTPUT RANGES FROM NORMAL OPERATION AND PERFORMING OF AGING TESTS

[75] Inventors: Ryoichi Hori, Hinode; Kiyoo Itoh, Higashikurume; Hitoshi Tanaka, Tachikawa, all of Japan

[73] Assignees: Hitachi, Ltd.; Hitachi Micro Computer Engineering, Ltd., both of Tokyo, Japan

[21] Appl. No.: 875,088

[22] Filed: Apr. 28, 1992

Related U.S. Patent Documents

Reissue of:

[64] Patent No.: 4,916,389
Issued: Apr. 10, 1990
Appl. No.: 140,628
Filed: Jan. 4, 1988

U.S. Applications:

[63] Continuation of Ser. No. 562,969, Dec. 19, 1983, abandoned, which is a continuation-in-part of Ser. No. 368,162, Apr. 14, 1982, Pat. No. 4,482,958.

[30] Foreign Application Priority Data

| | | | |
|---|---|---|---|
| Apr. 17, 1981 | [JP] | Japan | 56-57143 |
| Oct. 23, 1981 | [JP] | Japan | 56-168698 |
| Dec. 17, 1982 | [JP] | Japan | 57-220083 |

[51] Int. Cl.[6] ..... G01R 31/10; G01R 31/3173; H02M 3/158

[52] U.S. Cl. ..... 371/22.1; 323/269; 323/270; 323/303; 324/158.1; 327/538

[58] Field of Search ..... 324/158 T; 307/200 B, 307/501, 540, 297, 296.1, 272.3; 323/269, 270, 303; 371/22.1

[56] References Cited

U.S. PATENT DOCUMENTS

| | | | |
|---|---|---|---|
| 2,697,201 | 12/1954 | Harder | 323/229 |
| 3,386,030 | 5/1968 | Kann | 323/303 |
| 3,523,195 | 8/1970 | Thomas et al. | 235/197 |
| 3,553,487 | 1/1971 | Freeborn | 307/229 |
| 3,588,675 | 6/1971 | Suzuki | 323/22 |
| 3,742,338 | 6/1973 | Sugano et al. | 307/297 |
| 3,895,239 | 7/1975 | Alaspa | 307/268 |
| 4,239,980 | 12/1980 | Takanashi et al. | 307/205 |
| 4,368,524 | 1/1983 | Nakamura et al. | 365/226 |
| 4,385,243 | 5/1983 | Suzuki | 307/350 |
| 4,409,677 | 10/1983 | Takemac et al. | 365/206 |
| 4,433,252 | 2/1984 | Lewis | 307/269 |
| 4,446,381 | 5/1984 | Dalrymple | 307/200 B |
| 4,455,628 | 6/1984 | Ozaki et al. | 365/226 |
| 4,482,985 | 11/1984 | Itoh et al. | 365/226 |
| 4,495,622 | 1/1985 | Charrau | 371/20 |
| 4,585,955 | 4/1986 | Uchida | 307/297 |

FOREIGN PATENT DOCUMENTS

| | | | |
|---|---|---|---|
| 55-47414 | 4/1980 | Japan | 324/132 |
| 59-191935 | 10/1984 | Japan | 324/158 R |

OTHER PUBLICATIONS

Itoh, K. et al., "An Experimental 1Mb DRAM With On-Chip Voltage Limiter", *1984 IEEE International Solid--State Circuits Conf.*, pp. 282–283.

Buchsbaum, W., *Encyclopedia of Integrated Circuits*, Prentice-Hall, 1987, pp. 65–67, 113, 114.

Love, R. et al., "Width-to-Length Ratio Design Program for Interacting Static FET Circuits", IBM Technical Diclosure Bulletin, vol. 16, No. 11, Apr. 1974, pp. 3671–3673.

*Primary Examiner*—Stephen M. Baker
*Attorney, Agent, or Firm*—Antonelli, Terry, Stout & Kraus

[57] ABSTRACT

In a voltage converter which is disposed in a semiconductor integrated circuit so as to lower an external supply voltage and to feed the lowered voltage to a partial circuit of the integrated circuit, the voltage converter is constructed so as to produce an output voltage suited to an ordinary operation in the ordinary operation state of the semiconductor integrated circuit and an aging voltage in the aging test of the circuit.

27 Claims, 16 Drawing Sheets

SEMICONDUCTOR INTEGRATED CIRCUIT WITH VOLTAGE LIMITER HAVING DIFFERENT OUTPUT RANGES FROM NORMAL OPERATION AND PERFORMING OF AGING TESTS

Matter enclosed in heavy brackets [ ] appears in the original patent but forms no part of this reissue specification; matter printed in italics indicates the additions made by reissue.

[This application is a continuation of application Ser. No. 562,969, filed December 19, 1983, now abandoned.]

*This is a reissue of application Ser. No. 140,628, filed Jan. 4, 1988, now U.S. Pat. No. 4,916,389, which is a Continuation of application Ser. No. 562,969, filed Dec. 19, 1983, now abandoned, which is a Continuation-In-Part of application Ser. No. 368,162, filed Apr. 14, 1982, now U.S. Pat. No. 4,482,958.*

BACKGROUND OF THE INVENTION

The present invention relates to a voltage converter which lowers an external supply voltage within a semiconductor integrated circuit chip to drive circuits on the chip having small geometries.

Reduction in the geometries of devices such as bipolar or MOS transistors has been accompanied by a lowering in the breakdown voltages of the devices, which has made it necessary to lower the operating voltage of small geometry devices with an integrated circuit. From the viewpoint of users, however, a single voltage source of for example 5 V which is easy to use is desirable. As an expedient for meeting such different requests of IC manufacturers and the users, it is considered to be necessary to lower the external supply voltage $V_{CC}$ within a chip and to operate the small geometry devices with the lowered voltage $V_L$.

FIG. 1 shows an example of such an expedient, in which the circuit A' of the whole chip 10 including, e.g., an input/output interface circuit is operated with the internal supply voltage $V_L$ lowered by a voltage converter 13.

FIG. 2 shows an integrated circuit disclosed in Japanese Patent Application No. 56–57143 (Japanese Laid-open Patent Application No. 57–172761). The small geometry devices are employed for a circuit A determining the substantial density of integration of the chip 10, and are operated with the voltage $V_L$ obtained by lowering the external supply voltage $V_{CC}$ by means of a voltage converter 13. On the other hand, devices of comparatively large geometries are employed for a driver circuit B including, e.g., an input/output interface which does not greatly contribute to the density of integration which are operated by applying $V_{CC}$ thereto. Thus, a large-scale integrated circuit (hereinbelow, termed "LSI") which operates with $V_{CC}$ when viewed from outside the chip becomes possible.

However, when such an integrated circuit is furnished with the voltage converter, an inconvenience is involved in an aging test which is performed after the final fabrication step of the integrated circuit.

The terminology "aging test" as used herein identifies a test performed after the final fabrication step of the integrated circuit during which voltages higher than in an ordinary operation are intentionally applied to the respective transistors in the circuit to test the integrated circuit for break down due to an inferior gate oxide film.

The aforementioned voltage converter in Japanese Patent Application No. 56–57143 functions to feed the predetermined voltage. Therefore, the circuit fed with the supply voltage by the voltage converter cannot be subjected to the aging test.

In order to solve this problem, an invention disclosed in U.S. Pat. No. 4,482,985 has previously been made, but it has had difficulty in the performance for actual integrated circuits. As illustrated in FIGS. 2 to 6 in that patent, according to the cited invention, an internal voltage increases up to an aging point rectilinearly or with one step of change as an external supply voltage increases. Accordingly, the internal voltage changes greatly with the change of the external supply voltage. This has led to the disadvantage that the breakdown voltage margins of small geometry devices in an ordinary operation become small.

SUMMARY OF THE INVENTION

An object of the present invention is to further advance the invention disclosed in U.S. Pat. No. 4,482,985 referred to above, and to provide a voltage converter which can widen the margins of the breakdown voltages of small geometry devices in an ordinary operation and which affords sufficient voltages in an aging test.

The present invention consists in that the output voltage of a voltage converter is set at a voltage suitable for the operations of small geometry devices against the change of an external supply voltage when a semiconductor integrated circuit is in its ordinary operation region, and at an aging voltage when the ordinary operation region is exceeded.

To this end, according to the voltage converter of the present invention, when the external supply voltage has been changed from the lower limit value of the ordinary operation range thereof to the aging operation point thereof, the output voltage of the voltage converter changes up to the aging voltage without exhibiting a constant changing rate versus the change of external supply voltage.

DESCRIPTION OF THE PREFERRED EMBODIMENTS

Voltage converter circuit forms for affording various output characteristics versus an external supply voltage $V_{CC}$, as well as practicable examples thereof, will be first described, followed by practicable embodiments on a method of feeding power to the voltage converter and on a buffer circuit for the voltage converter well suited to drive a large load.

Figure 1:
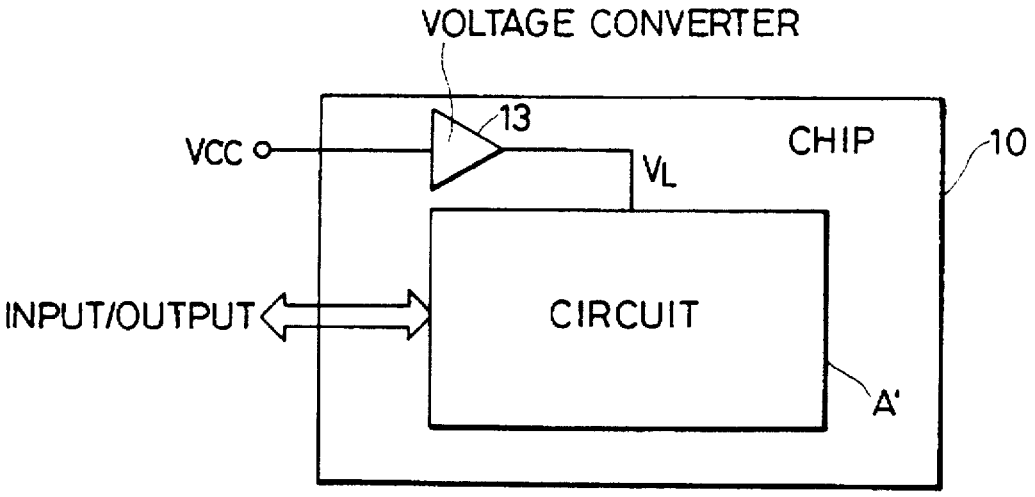
FIG. 1 PRIOR ART
FIGS. 1 and 2 show semiconductor integrated circuits each having a voltage converter.
Figure 2:
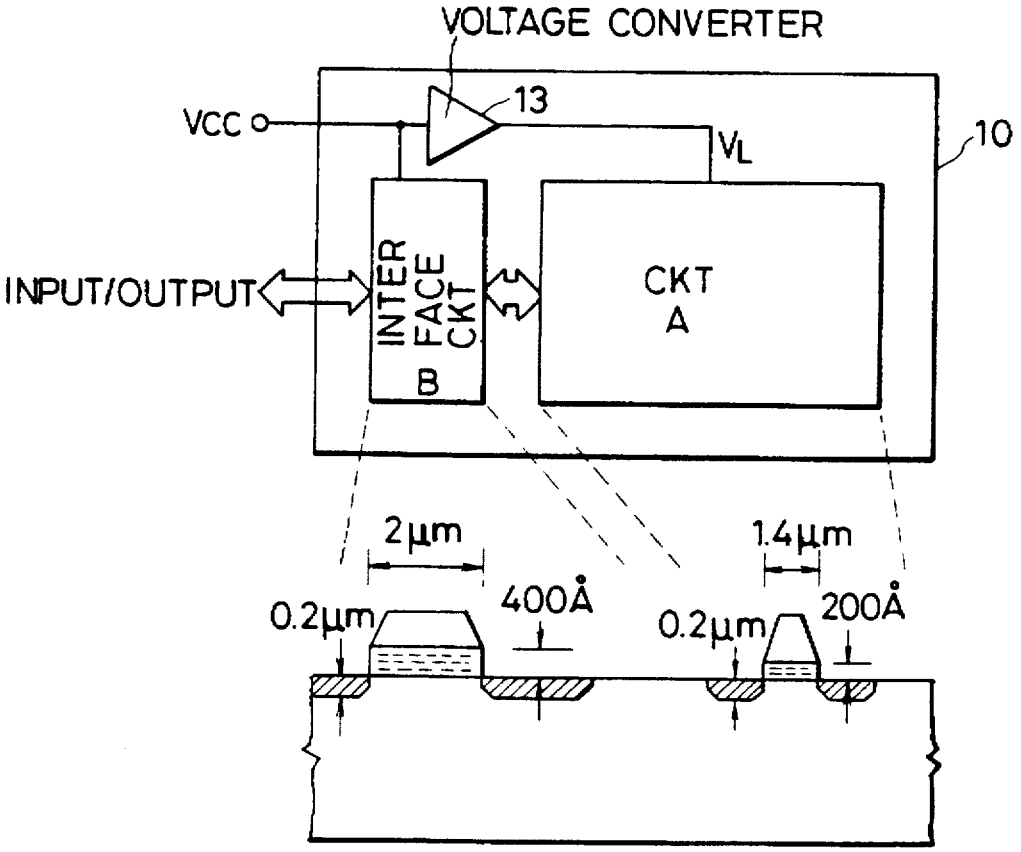
FIG. 2 PRIOR ART
Figure 3:
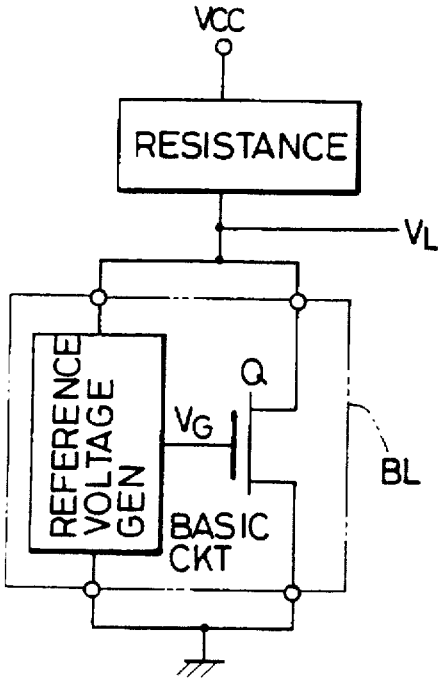
FIGS. 3 and 5 show basic circuits each of which constitutes a device embodying the present invention.
Figure 5:
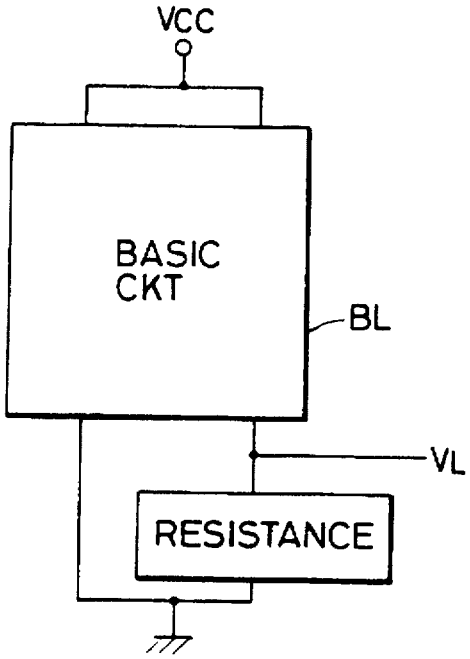

FIGS. 3 and 5 show basic circuits which are used for forming voltage converter embodiments of the present invention for providing a voltage $V_L$ to circuits such as shown in FIGS. 1 and 2.

Figure 4:
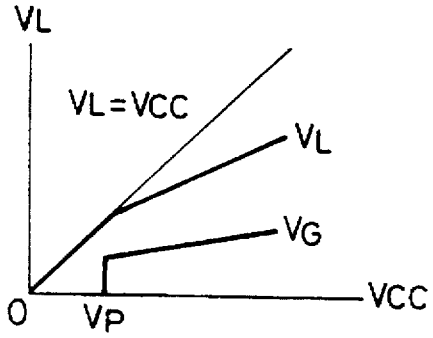
FIGS. 4 and 6 show the characteristics of the circuits in FIGS. 3 and 5, respectively.
Figure 23:
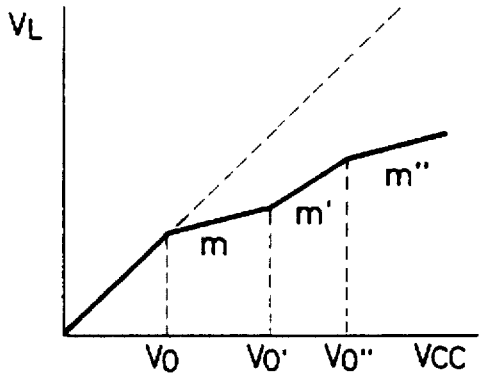
FIG. 23 shows a characteristic in another embodiment of the present invention.

In the circuit of FIG. 3, a resistance $R_3$ in FIG. 23 of U.S. Pat. No. 4,482,985 is replaced by a variable impedance arrangement described below, and a transistor Q is employed in order to enhance a current driving ability for a load to which an output voltage $V_L$ is applied. Here, the control terminal voltage $V_G$ of the transistor Q has a characteristic which changes versus the change of an external supply voltage $V_{CC}$ and which is the output voltage of a reference voltage generator REF. More specifically, as illustrated in FIG. 4, in a case where the external supply voltage $V_{CC}$ is gradually increased from 0 (zero) V, the voltage $V_G$ rises abruptly when a certain voltage $V_P$ has been reached, so that the transistor Q turns "on". For $V_{CC}$ not smaller than $V_P$, Q continues to turn "on". Therefore, the effective impedance of the whole basic circuit BL decreases, and the ratio thereof with the effective impedance R changes, so that the voltage $V_L$ becomes a straight line of different slope for $V_{CC}$ not smaller than $V_P$ as shown in FIG. 4. Here in FIG. 4, the example is illustrated in which $V_G$ rises abruptly from O V to a certain voltage for $V_{CC}$ not smaller than $V_P$. However, it is also allowed to adopt a characteristic in which, in case of changing $V_{CC}$ from O V, $V_G$ rises gradually from O V and becomes, at the point $V_P$, a voltage level to turn "on" the transistor Q. Regarding the example in which $V_G$ rises abruptly at and above the certain voltage $V_{CC}$, the reference voltage generator can be realized by the cascade connection of devices having rectification characteristics as taught in U.S. Pat. No. 4,482,985. Regarding the example in which $V_G$ rises gradually, the reference voltage generator can be realized by a simple resistance divider circuit. In FIG. 4, the coefficient of $V_L$ relative to $V_{CC}$ can be changed at will by the designs of the resistance and the transistor Q.

Figure 6:
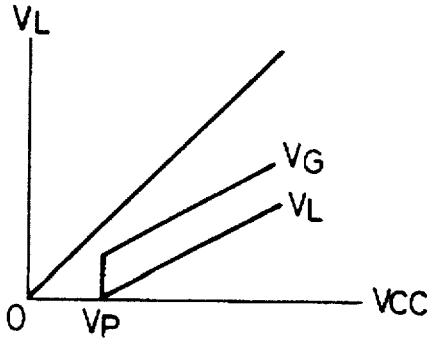

FIG. 5 shows another example which employs the same basic circuit BL as in FIG. 3. Whereas the example of FIG. 3 derives $V_L$ from the $V_{CC}$ side, this example derives $V_L$ from the ground side. When the characteristic of the output voltage $V_G$ from the reference voltage generator is set in advance so that the transistor Q may turn "on" at $V_{CC}$ not smaller than $V_P$, $V_L$ is determined by the effective impedance of the whole basic circuit BL and the effective impedance R, and hence, $V_L$ becomes as shown in FIG. 6.

While FIGS. 3 and 5 have exemplified the transistors as being MOS transistors, bipolar transistors may be used if desired. Particularly in a case where whole chips are constructed of MOS transistors in the examples of FIGS. 1 and 2, it is usually easier to design them when the circuits of FIGS. 3 and 5 are constructed of MOS transistors. In a case where the whole chips are of bipolar transistors, it is more favorable to use bipolar transistors. It is sometimes the case, however, that the chip includes both MOS transistors and bipolar transistors. It is to be understood that, in this case, the MOS transistor or/and the bipolar transistor can be used for the circuit of FIG. 3 or FIG. 5 in accordance with an intended application. In addition, although the examples of FIGS. 4 and 6 have been mentioned as the characteristics of the circuit REF, these examples are not especially restrictive, but the characteristic of the circuit REF may be set according to the purpose of the design of $V_L$.

Figure 7:
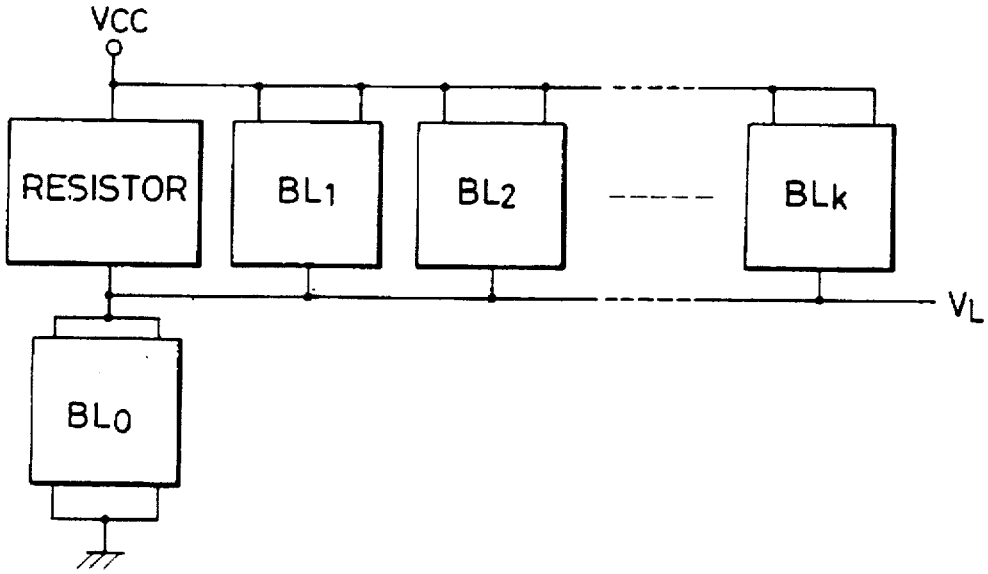
FIGS. 7, 9 and 11 show devices embodying the present invention.
Figure 8:
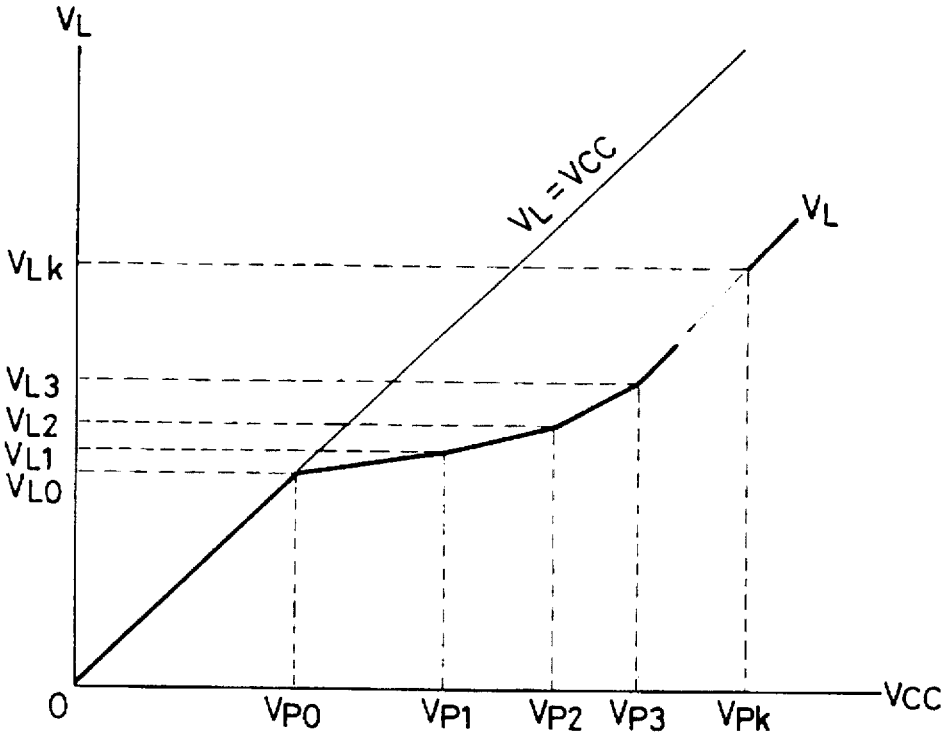
FIGS. 8, 10 and 12 show the characteristics of the circuits in FIGS. 7, 9 and 11, respectively.

Now, a voltage converter based on the circuit of FIG. 3 will be described. FIGS. 7 and 8 illustrate an example in which the basic circuits BL numbering k are connected in parallel with the effective impedance R of the circuit of FIG. 3 (formed by the resistor and the basic circuit $BL_0$). Each of the basic circuits BL corresponds in structure to the basic circuit BL shown in FIG. 3, but are respectively set to turn on their transistors Q at different levels of the supply voltage $V_{CC}$. For example, the circuits REF in the respective basic circuits BL are set so that $BL_0$ may first turn "on" at $V_{P0}$, $BL_1$ may subsequently turn "on" at $V_{P1}$, and $BL_k$ may lastly turn "on" at $V_{Pk}$ as shown in FIG. 8. The transistors in the respective circuits BL are designed so that the coefficients of the changes of the respective voltages $V_L$ versus the voltage $V_{CC}$ may be varied. As $V_{CC}$ increases more, impedances are successively added in parallel with the impedance R of the resistor and the basic circuit $BL_0$, so that the entire characteristic of $V_L$ becomes concave for $V_{CC}$ not smaller than $V_{P0}$.

The coefficients of the changes are varied for the following reason. For example, in a case where the aging operation points are $V_{P2}$, $V_{P3}$, . . . and $V_{Pk}$ and where the aging voltages of circuits to be fed with the supply voltages by the voltage converter are $V_{L2}$, $V_{L3}$, . . . and $V_{Lk}$, the transition is smoothed when the first aging operation point shifts to the next one.

The present circuit is a circuit which is practical in terms of the operating stability of the ordinary operation and an effective aging for the system of FIG. 2. By way of example, the $V_{CC}$ operation point in the ordinary operation is set at a point at which $V_L$ changes versus $V_{CC}$ as slightly as possible, that is, the coefficient of change is the smallest, in order to achieve a stable operation. In fact, if desired, the coefficient of change of $V_L$ versus $V_{CC}$ can be set to be zero in the range between $V_{P1}$ and $V_{P2}$ for the ordinary operation so that a constant voltage $V_L$ is held in this entire range. Alternatively, a small positive slope can be used in this, as shown in FIG. 8. On the other hand, the $V_{CC}$ operation point in the aging test is set at a point at which the coefficient of change is great, in order to approximately equalize the stress voltage conditions of transistors of large geometries receiving $V_{CC}$ to stress voltage conditions of transistor of small geometries receiving $V_L$ as described in, U.S. Pat. No. 4,482,985. Specifically, large geometry devices such as those found in the interface circuit B of FIG. 2 are operated during aging tests at a higher potential than small geometry devices in circuit A at the reduced potential produced by voltage converter 13. More concretely, in case of using only $BL_0$ and $BL_1$ in the circuit of FIG. 7, the coefficient of change in FIG. 8 may be made small between the lower limit voltage $V_{P0}$ (e.g., 2–3 V) and the upper limit voltage $V_{P1}$ (e.g., 6 V), to set the ordinary operation point (e.g., 5 V) concerning $V_{CC}$ for the ordinary operation range in this section, while the coefficient of change may be made great between $V_{P1}$ and $V_{P2}$ (e.g., $V_{P2}$ being 7–9 V), to set the aging operation point (e.g., $V_{CC}$=8 V) in this section. The ordinary operation range is solely determined by ratings, and it is usually set at 5±0.5 V. It is to be understood that, for some purposes of designs, the operation voltage points and the aging voltage points can be set at any desired $V_{CC}$ points by employing the basic circuits $BL_2$, $BL_3$ . . . etc. When more circuits BL are used, the $V_L$ characteristic can also be made smoother versus $V_{CC}$, so that the operation of the internal circuit can be stabilized more. Further, since the $V_{CC}$ voltage is high in the aging test, it is effective to construct the voltage converter itself using high breakdown voltage transistors. To this end, the voltage converter may be constructed of transistors of large geometry in the system of FIG. 2 by way of example.

Figure 9:
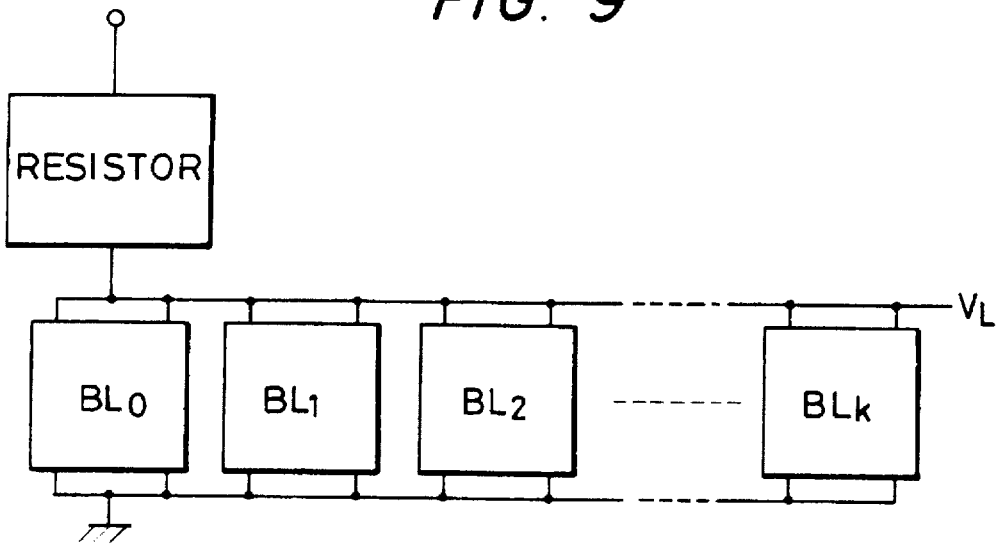
Figure 10:
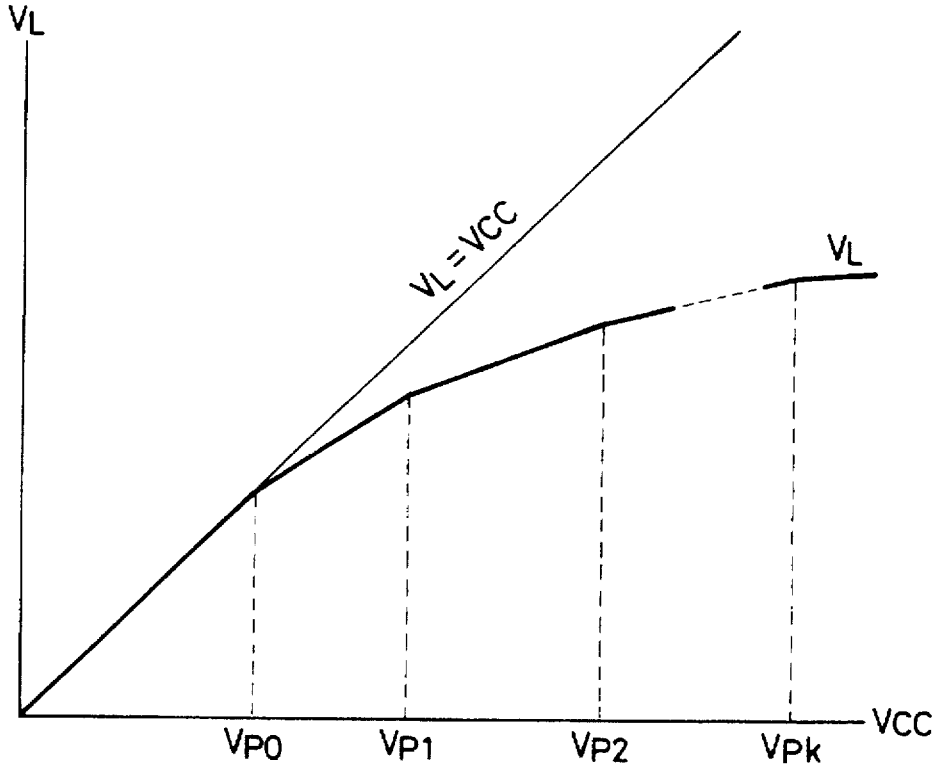

FIGS. 9 and 10 show an example of using the FIG. 4 arrangement with additional basic circuits BL being connected in parallel on the ground side. In this arrangement, by setting the respective circuits BL to have different turn-on times, the characteristic of the whole $V_L$ can be made convex relative to $V_{CC}$, as shown in FIG. 10. This characteristic is effective for protecting the circuit A' from any overvoltage $V_L$ in the system of FIG. 1 by way of example. This achieves the advantage that, in case of measuring the $V_{CC}$ voltage margin of the whole chip, a sufficiently high voltage $V_{CC}$ can be applied without destroying small geometry devices.

In some uses, it is also possible that the circuits of FIGS. 7 and 9 can coexist. By way of example, the ordinary operation point is set at a point at which the coefficient of change is small, and the aging operation point is set at a point at which the coefficient of change is great. These are realized by $BL_0$ and $BL_1$ in the circuit of FIG. 7. Further, in order to make the coefficient of change small again at and above the $V_{CC}$ point of the aging condition to the end of preventing the permanent breakdown of devices, the basic circuits BL other than $BL_0$ are connected so as to operate in parallel with the latter as in the circuit form of FIG. 9. This makes it possible to design a circuit in which the devices are difficult to break down at and above the $V_{CC}$ point of the aging operation.

Thus, even when the supply voltage has erroneously been made abnormally high, by way of example, the breakdown of the devices can be prevented.

Figure 11:
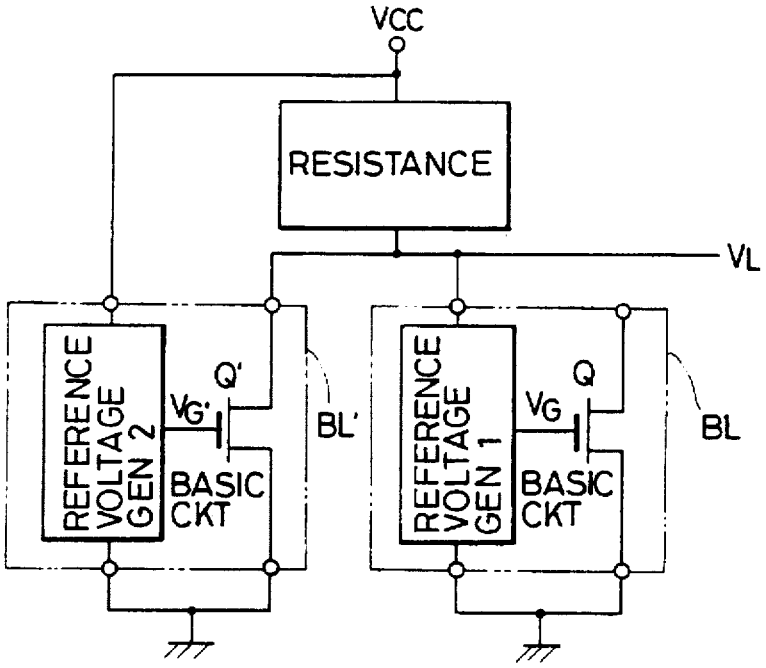
Figure 12:
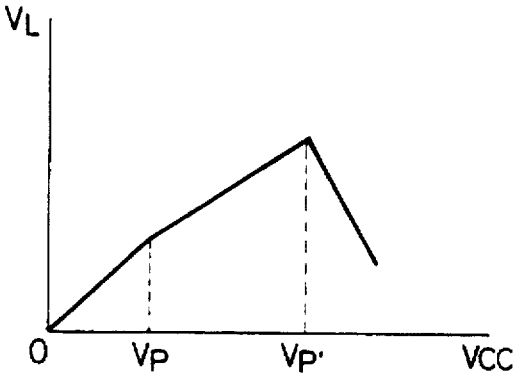

FIGS. 11 and 12 show an example in which a basic circuit BL' is connected in parallel with the circuit of FIG. 3, whereby the changing rate of $V_L$ is made negative at and above $V_P$' which is a certain value of $V_{CC}$. More specifically, when $V_{CC}$ is increased, the transistor Q first turns "on" while the output voltage $V_G$ of the reference voltage generator 1 in the basic circuit BL is not lower than $V_P$, so that the gradient of $V_L$ versus $V_{CC}$ decreases. A reference voltage generator 2 is designed so that a transistor Q' in the basic circuit BL' may subsequently turn "on" at the certain $V_{CC}$ value, namely, $V_P$'. In addition, the conductance of Q' is designed to be sufficiently higher than that of Q. Then, the $V_L$ characteristic after the conduction of the transistor Q' is governed by the characteristic of BL', so that $V_L$ comes to have the negative gradient as shown in FIG. 12.

The merit of the present circuit is that, when the aforementioned point at which $V_L$ lowers is set at or below the breakdown voltages of small geometry devices, these small geometry devices are perfectly protected from breakdown even when the voltage $V_{CC}$ has been sufficiently raised. For example, a measure in which the output voltage $V_L$ lowers when a voltage higher than the external supply voltage $V_{CC}$ at the aging point has been applied is especially effective because any voltage exceeding the aging point is not applied to the devices.

It is to be understood that an external instantaneous voltage fluctuation can also be coped with.

Obviously, the circuit of FIG. 5 can afford any desired $V_L$ characteristic by connecting the basic circuit BL' in parallel as in the example of FIG. 3.

While, in the above, the conceptual examples of the voltage converters have been described, practicable circuit examples based on these concepts will be stated below.

Figure 13A:
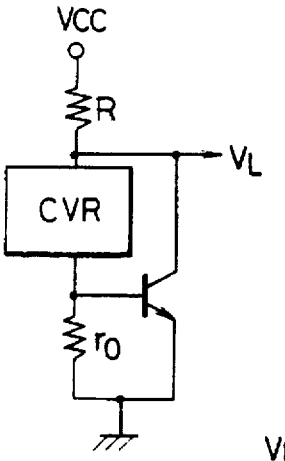
FIG. 13(A) (PRIOR ART)
FIGS. 13(A) to (C) and 14(A) to (C) show prior art voltage regulators and FIGS. 13B and 14B show the formation of the circuit of FIG. 3 in practicable forms and characteristics of such practicable forms.
Figure 13B:
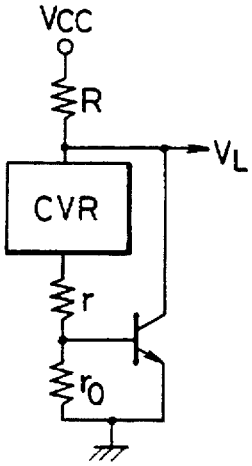
Figure 13C:
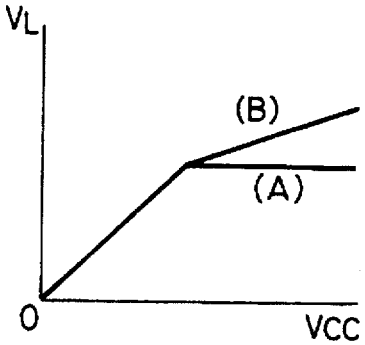

FIG. 13A shows an example of the circuit of FIG. 3 which employs a bipolar transistor. A voltage regulator circuit CVR is, for example, a cascade connection of Zener diodes or ordinary diodes the terminal voltage of which becomes substantially constant. FIG. 13(A) indicates a well-known voltage regulator which has the characteristic shown by (A) in FIG. 13(C). This voltage regulator is described in detail in "Denpa-Kagaku (Science of Electric Wave)", February 1982, p. 111 or "Transistor Circuit Analysis", by Joyce and Clarke, Addison-Wesley Publishing Company, Inc., p. 207. Since, however, $V_L$ is a fixed voltage in this condition, a resistance r can be connected in series with the CVR as shown in FIG. 13(B) in accordance with the present invention to slope the curve as desired. Thus, $V_L$ comes to have a slope relative to $V_{CC}$ as shown by the characteristic (B) shown in FIG. 13(C).

Figure 14A:
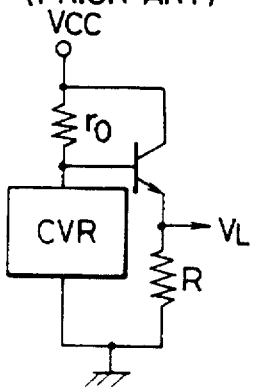
FIG. 14(A) (PRIOR ART)
Figure 14B:
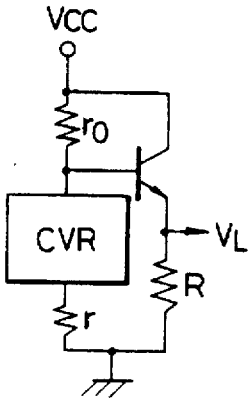
Figure 14C:
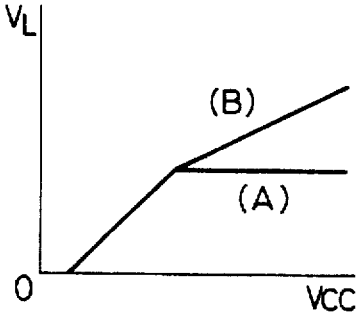

FIG. 14 shows another embodiment. FIG. 14(A) indicates a well-known voltage regulator which employs an emitter follower and which has the characteristic shown by (A) in FIG. 14(C). Since $V_L$ is also a fixed voltage, a resistance r is used in FIG. 14(B) in order to provide a desired slope. Thus, a characteristic as shown as characteristic (B) in FIG. 14(C) is provided.

These examples of FIGS. 13 and 14 are especially suited to the system as shown in FIG. 1. In FIG. 1, usually a great current flows through the circuit associated with the input/output interface. Therefore, a high current driving ability is required of the voltage converter correspondingly. Obviously, the voltage converter constructed of the bipolar transistor is suited to this end.

Next, there will be explained practicable examples in which voltage converters are constructed of MOS transistors on the basis of the circuits of FIGS. 3, 7, 9 and 11.

Figure 15:
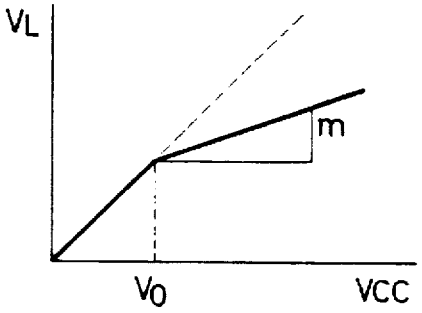
FIG. 15 shows the characteristic in FIG. 4 more specifically.

FIG. 15 shows a concrete example of the characteristic of FIG. 4 in which $V_L$ is endowed with a slope m for $V_{CC}$ of and above a certain specified voltage $V_0$. Since the change of $V_L$ decreases for the voltage not smaller than $V_0$, the breakdown of small geometry devices is less likely to occur to that extent.

$V_L=V_{CC}$ is held for $V_{CC}$ smaller than $V_0$, for the following reason. In general, MOSTs have their operating speeds degraded by lowering in the threshold voltages thereof as the operating voltages lower. To the end of preventing this drawback, it is desirable to set the highest possible voltage on a lower voltage side such as $V_{CC}$ smaller than $V_0$. That is, $V_L$ should desirably be equal to $V_{CC}$.

Figure 16:
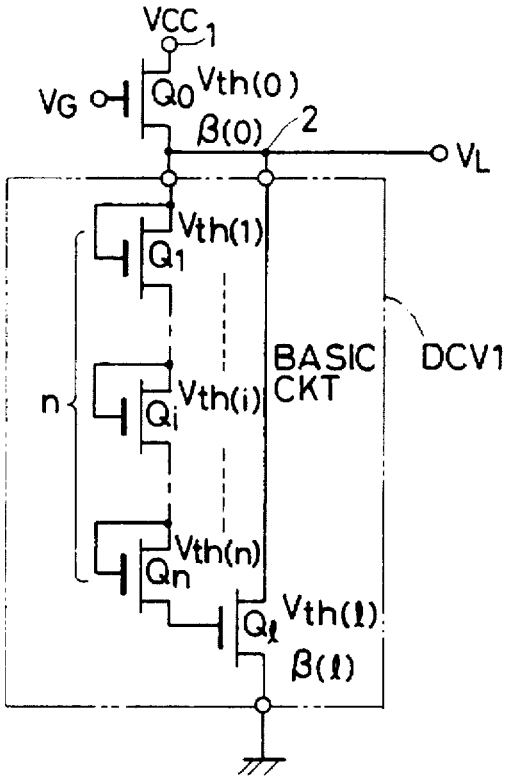
FIG. 16 shows another practicable example of the circuit in FIG. 3.

FIG. 16 shows an embodiment of a practicable circuit DCV therefor, which corresponds to a practicable example of the circuit of FIG. 3.

The features of the present circuit are that the output voltage $V_L$ is determined by the ratio of the conductances of MOS transistors $Q_0$ and $Q_l$, and that the conductance of the MOS transistor $Q_l$ is controlled by $V_L$.

With the present circuit, letting the gate voltage $V_G$ of $Q_O$ be $V_{CC}+V_{th(O)}$ (where $V_{th(O)}$ denotes the threshold voltage of the MOST $Q_O$), the control starting voltage $V_O$ and the slope m are expressed as follows:

$$V_0 = \sum_{i=1}^{n} V_{th(i)} + V_{th(l)}$$

$$m = \{1 + \sqrt{\beta(1)/\beta(O)}\}^{-1}$$

Here, $\beta(O)$ and $\beta(1)$ denote the channel conductances of $Q_O$ and $Q_l$, $V_{th(i)}$ (i=1–n) and $V_{th(l)}$ denote the threshold voltages of the MOS transistors $Q_i$(i=1–n) and $Q_l$, and n denotes the number of stages of $Q_i$.

Accordingly, $V_O$ and m can be varied at will by n, $V_{th(i)}$, $V_{th(l)}$ and $\beta(1)/\beta(O)$. It has been stated before that $V_L=V_{CC}$ is desirable for $V_{CC}$ smaller than $V_O$. In this regard, for $V_{CC}$ smaller than $V_O$, $V_L$ is determined by $V_O$ because $Q_l$ is "off". Therefore, the voltage $V_G$ of $Q_O$ must be a high voltage of at least $V_{CC}+V_{th(O)}$.

Figure 27:
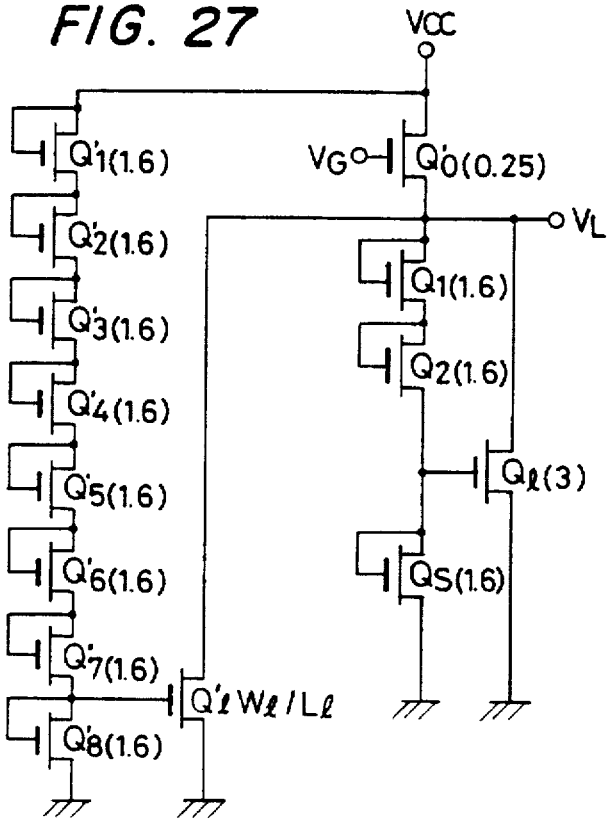
FIG. 27 shows a practicable example of the circuit in FIG. 26.

In order to simplify the computation and to facilitate the description, the circuit of FIG. 16 is somewhat varied from an actual circuit. As a practical circuit, as shown in FIG. 27 to be referred to later, a transistor of similar connection ($Q_{S(1.6)}$ in FIG. 27) needs to be further connected between the n-th one of the transistors connected in cascade and the ground. That is, a kind of diode connection is made toward the ground. With this measure, when $V_{CC}$ has been varied from the high voltage side to the low voltage side, the nodes of the transistors connected in cascade are prevented from floating states to leave charges behind. For the sake of the convenience of the description, the transistor of this measure shall be omitted in the ensuing embodiments.

Figure 17:
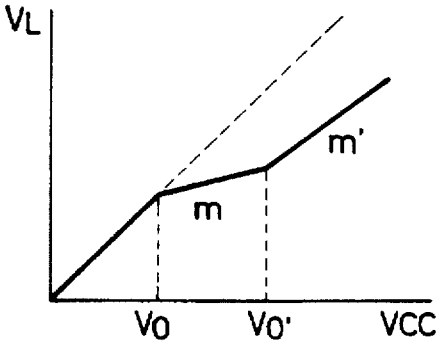
FIG. 17 shows the characteristic in FIG. 8 concretely.

FIG. 17 shows a characteristic in which, when the external supply voltage $V_{CC}$ changes between the lower limit value $V_O$ and upper limit value $V_O'$ of the ordinary operation range, the slope m of the output voltage $V_L$ is small, and a slope m' which corresponds to the external supply voltage greater than $V_O'$ is made steeper than m.

Figure 18:
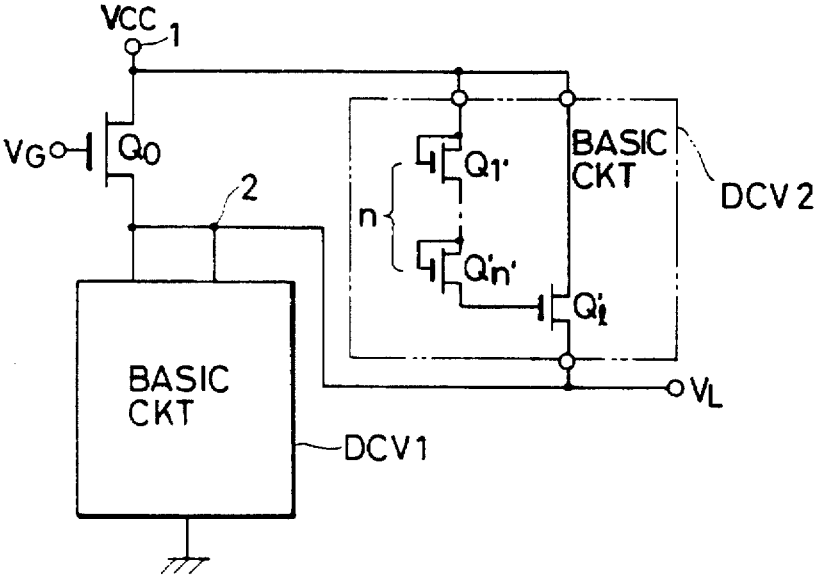
FIG. 18 shows a circuit for producing the characteristics in FIG. 17.

FIG. 18 shows an example of a circuit for producing the characteristic of FIG. 17.

These correspond to a practicable form of the example of FIGS. 7 and 8.

The feature of the present circuit is that, between the terminals 1 and 2 of the circuit DCV shown in FIG. 16, a circuit DCV2 similar to DCV1 is added, whereby the conductance of a load for DCV1 is increased at and above $V_O'$ so as to increase the slope of $V_L$.

With the present circuit, the second control starting voltage $V_O'$ is expressed by:

$$V_0' = V_0 + \left\{ \sum_{i=1}^{n} V_{th(i)} + V'_{th(l)} \right\} /(1 - m)$$

In addition, the slope m' is determined by the ratio between the sum of the conductances of the MOS transistors $Q_O$ and $Q'_l$ and the conductance of the MOS transistor $Q_l$. Here, $V'_{th(i)}$ (i=1–n') and $V'_{th(l)}$ denote the threshold voltages of the MOS transistors $Q'_i$ (i=1–n') and $Q'_l$, respectively.

Accordingly, $V'_O$ and m' can be varied at will by n, n', $\beta(1)$, $\beta'(1)$, $V_{th(i)}$, $V_{th(l)}$, $V'_{th(i)}$ and $V'_{th(l)}$. Here, $\beta'(1)$ denotes the channel conductance of the MOS transistor $Q'_l$.

This circuit has the ordinary operation range between the lower limit value $V_O$ and the upper limit value $V_O'$, and is effective when the aging point has a value larger than $V_O'$. That is, since the slope m is small in the ordinary operation region, margins for the breakdown voltages of small geometry devices are wide, and power consumption does not increase. Here, the slope m' for the external supply voltage higher than the ordinary operation region is set for establishing a characteristic which passes an aging voltage (set value).

Figure 19:
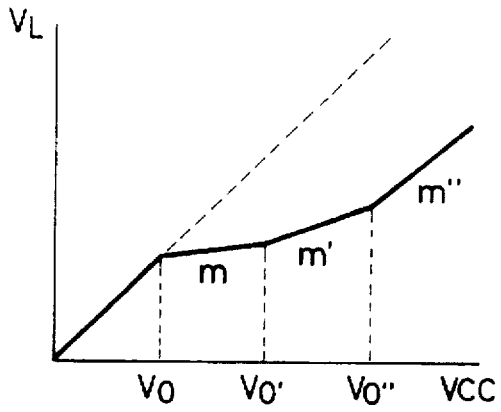
FIG. 19 shows the characteristic in FIG. 8 concretely.

In an example illustrated in FIG. 19, a characteristic in which the slope of $V_L$ becomes m" greater than m' when the external supply voltage $V_{CC}$ has reached $V_O''$ is further added to the characteristic shown in FIG. 17.

Figure 20:
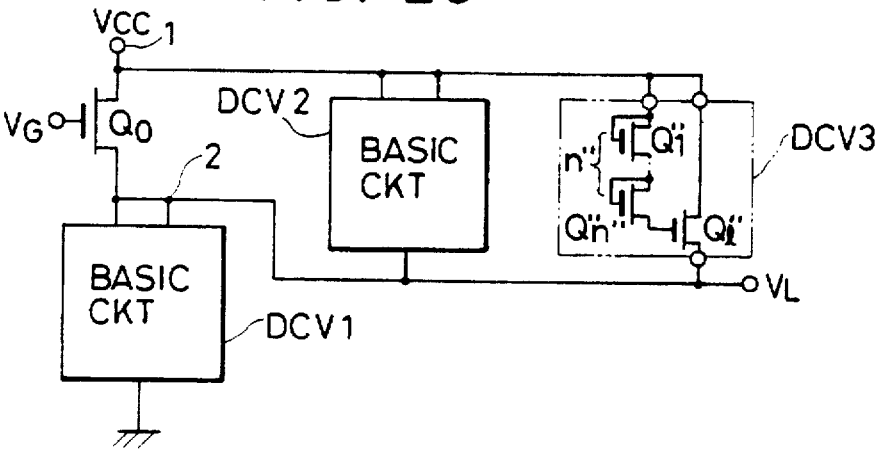
FIG. 20 shows a circuit for producing the characteristics in FIG. 19.

FIG. 20 shows an example of a practicable circuit therefor. These correspond to a concrete form of the example of FIGS. 7 and 8. The feature of the present circuit is that circuits DCV2 and DCV3 similar to the circuit DCV1 are added between the terminals 1 and 2 of the circuit shown in FIG. 16, whereby the conductance of the load for DCV1 is successively increased so as to increase the slope of $V_L$ in two stages at the two points $V_O'$ and $V_O''$.

With the present circuit, the second and third control starting voltages $V_O'$ and $V_O''$ are respectively expressed by:

$$V_0' = V_0 + \left\{ \sum_{i=1}^{n'} V'_{th(i)} + V'_{th(l)} \right\} /(1 - m)$$

$$V_0'' = V_0' + \left\{ \sum_{i=1}^{n''} V''_{th(i)} + V_{th(l)} - \sum_{i=1}^{n'} V'_{th(i)} - V'_{th(l)} \right.$$

Here, $V''_{th(i)}$ (i=1–n") and $V''_{th(l)}$ denote the threshold voltages of the MOS transistors $Q''_i$ (i=1–n") and $Q''_l$, respectively. Besides, the slope m' is determined by the ratio between the sum of the conductances of the MOS transistors $Q_O$ and $Q'_l$ and the conductance of the MOS transistor $Q_l$, and the slope m" by the ratio between the sum of the conductances of the MOS transistors $Q_O$, $Q'_l$ and $Q''_l$ and the conductance of the MOS transistor $Q_l$.

Accordingly, $V_O'$ and m' can be varied at will by n, n', $\beta(O)$, $\beta(1)$, $\beta'(1)$, $V_{th(i)}$, $V_{th(l)}$, $V'_{th(i)}$ and $V'_{th(l)}$, while $V''_O$ and m" by n, n', n", $\beta(O)$, $\beta(1)$, $\beta'(1)$, $\beta''(1)$, $V_{th(i)}$, $V_{th(l)}$, $V'_{th(i)}$, $V'_{th(l)}$, $V''_{th(i)}$ and $V''_{th(l)}$. Here, $\beta''(1)$ denotes the channel conductance of $Q''_l$.

This circuit is effective when the ordinary operation range extends between the lower limit value $V_O$ and the upper limit value $V_O'$, and aging tests are carried out in the two sections of the external supply voltage $V_{CC} \geqq V_O''$ and $V_O' < V_{CC} < V_O''$. The aging tests in the two sections consist of the two operations: aging for a short time, and aging for a long time. The former serves to detect a defect occurring, for example, when an instantaneous high stress has been externally applied, while the latter serves to detect a defect ascribable to a long-time stress.

Figure 21:
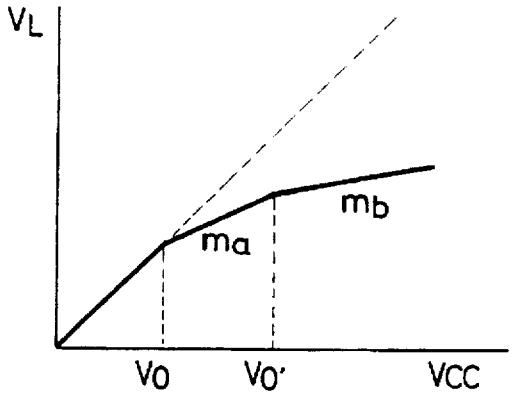
FIG. 21 shows the characteristic in FIG. 10 concretely.

FIG. 21 shows an example wherein, when the external supply voltage $V_{CC}$ is greater than $V_O'$, the slope m' of the voltage $V_L$ is set at m>m' under which the output voltage $V_L$ follows up the external supply voltage $V_{CC}$.

Figure 22:
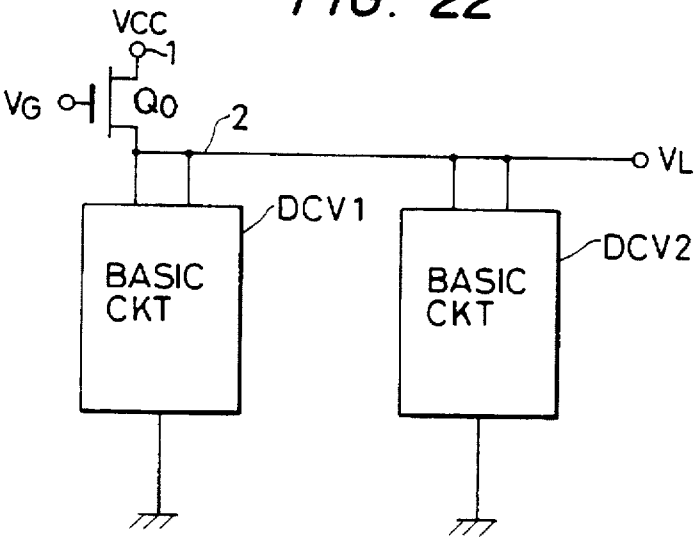
FIG. 22 shows a circuit for producing the characteristic in FIG. 21.

FIG. 22 shows an embodiment of a practicable circuit therefor. These correspond to a concrete form of the example of FIGS. 9 and 10. The feature of the present circuit is that a circuit DCV2 similar to DCV1 is added between the terminal 2 and ground of the circuit shown in FIG. 16, whereby the conductance of a load for the transistor $Q_O$ is increased at $V_O'$ so as to decrease the slope of $V_L$.

With the present circuit, the second control starting voltage $V_O'$ is expressed by:

$$V_0' = -\frac{1-m}{m} V_0 + \left\{ \sum_{i=1}^{n'} V'_{th(i)} + V'_{th(l)} \right\} /m$$

In addition, the slope m' is expressed by the ratio between the conductance of $Q_O$ and the sum of the conductances of $Q_l$ and $Q'_l$.

Accordingly, $V_O'$ and m' can be varied at will by n, n', β(O), β(l), β'(l), $V_{th(i)}$, $V_{th(l)}$, $V'_{th(i)}$ and $V'_{th(l)}$.

This circuit is applicable to devices of lower breakdown voltages. Usually, when the breakdown voltages of devices are low, the output voltage $V_L$ of the ordinary operation region ($V_O < V_{CC} < V_O'$) may be suppressed to a low magnitude. In some cases, however, the magnitude of $V_L$ cannot be lowered because the operating speeds of a circuit employing small geometry devices and a circuit employing large geometry devices are matched. In such cases, the slope $m_a$ of the output voltage $V_L$ is decreased in order for the aging operation point to be passed. Thus, the magnitude of the output voltage $V_L$ can be raised near to the withstand voltage limit of the devices within the range of the ordinary operation region, and the operating speed of the circuit employing the small geometry devices can be matched with that of the circuit employing the large geometry devices.

In an example shown in FIG. 23, a characteristic in which the slope of $V_L$ becomes m" smaller than m' when the external supply voltage $C_{CC}$ has reached $V_O''$ is further added to the characteristic illustrated in FIG. 17.

Figure 24:
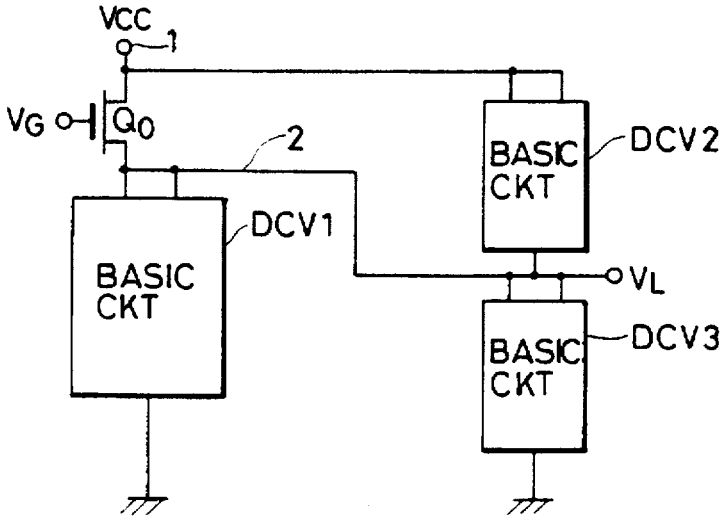
FIG. 24 shows a circuit for producing the characteristic in FIG. 23.

FIG. 24 shows an embodiment of a practicable circuit therefor. This corresponds to an example in which the examples of FIGS. 7 and 9 coexist. The feature of the present circuit is that the embodiments of FIGS. 18 and 21 are combined thereby to increase and decrease the slope of $V_L$ at the two points $V_O'$ and $V_O''$ respectively.

With the present circuit, the second and third control starting voltages $V_O'$ and $V_O''$ are respectively expressed by:

$$V_0' = V_0 + \left\{ \sum_{i=1}^{n'} V'_{th(i)} + V'_{th(l)} \right\} /(1-m)$$

$$V_0'' = V_0' + \left\{ \sum_{i=1}^{n''} V''_{th(i)} + V''_{th(i)} + \sum_{i=1}^{n'} V'_{th(i)} + V'_{th(l)} - V_0' \right\} /m'$$

In addition, the slope m' is expressed by the ratio between the sum of the conductances of $Q_O$ and $Q_l'$ and the conductance of $Q_l$, while m" is expressed by the ratio between the sum of the conductances of $Q_O$ and $Q_l'$ and the sum of the conductances of $Q_l$ and $Q_l''$.

Accordingly, $V_O'$ and m' can be varied at will by n, n', β(O), β(l), β'(l), $V_{th(i)}$, $V'_{th(i)}$ and $V'_{th(l)}$, while $V_O''$ and m" can be varied by n, n', n", β(O), β(l), β'(l), β"(l), $V_{th(i)}$, $V_{th(l)}$, $V'_{th(i)}$, $V'_{th(l)}$, $V''_{th(i)}$ and $V''_{th(l)}$.

This circuit protects small geometry devices from permanent breakdown in such a way that, even when $V_{CC}$ has become higher than the withstand voltage limit $V_O''$ of the devices due to some fault of the external power source, it does not exceed a breakdown voltage $V_B$. That is, the slope m" of $V_L$ for $V_{CC}$ not smaller than $V_O''$ is made gentler than the slope m' in the aging, whereby even when the external supply voltage $V_{CC}$ has become $V_O''$ or above, the output voltage $V_L$ is prevented from exceeding the breakdown voltage (usually, higher than the withstand voltage limit) of the devices. This makes it possible to prevent the device breakdown even when the supply voltage has been raised abnormally by way of example.

Figure 25:
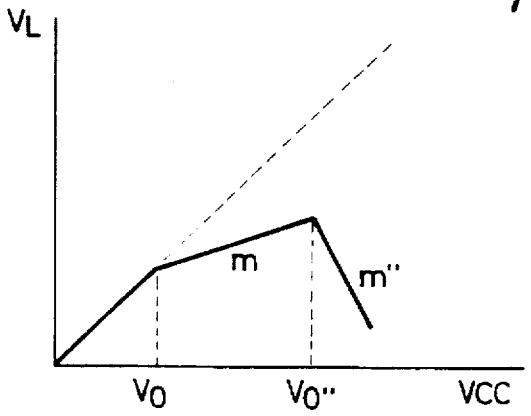
FIG. 25 shows the characteristic in FIG. 12 concretely.

FIG. 25 shows an example in which the slope m' is made negative when the external supply voltage $V_{CC}$ has exceeded $V_O'$.

Figure 26:
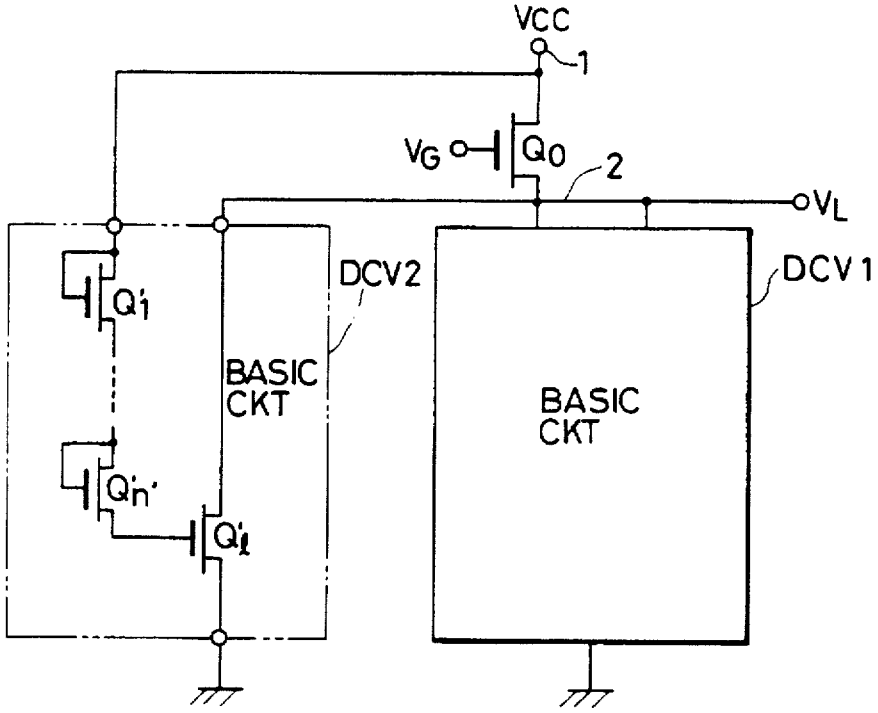
FIG. 26 shows a circuit for producing the characteristic in FIG. 25.

FIG. 26 shows an embodiment of a practical circuit therefor. These correspond to a concrete form of the example of FIGS. 11 and 12. The feature of the present circuit is that the drain of $Q_1'$ in DCV2 is connected to the terminal 1 of the circuit shown in FIG. 16, the drain of $Q_l'$ to the terminal 2, and the source of $Q_l'$ to the ground, whereby the conductance of $Q_l'$ is controlled by $V_{CC}$, and besides, it is made greater than the conductance of $Q_O$ so as to establish m'<O.

With the present circuit, the second control starting voltage $V_O'$ and the slope m' are expressed by the following on the assumption of $\beta'(l) \geqq \beta(O)$:

$$V_0' = \sum_{i=1}^{n'} V'_{th(i)} + V'_{th(l)}$$

$$m' = 1 - \sqrt{\beta'(l)/\beta(0)}$$

Accordingly, $V_O'$ and m' can be varied at will by n', $V'_{th(i)}$, $V'_{th(l)}$ and β'(l)/(O).

Figure 28:
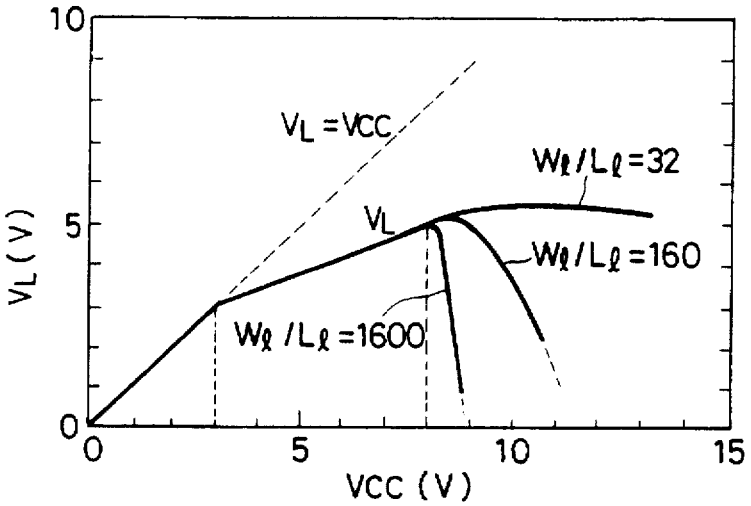
FIG. 28 shows the actual characteristics of the circuit in FIG. 27.

FIGS. 27 and 28 show a practicable example of the present circuit and examples of the characteristics thereof. All the threshold voltages of transistors are 1 (one) V, and $V_G = V_{CC} + V_{th(O)}$ is held. In addition, numerals in parentheses indicate values obtained by dividing the channel widths by the channel lengths of the transistors. FIG. 28 illustrates $V_L$ with a parameter being the corresponding value $W_l/L_l$ of $Q_l'$. By way of example, the voltage in the ordinary operation is set at 5 V, and the aging voltage at 8 V.

This circuit consists in that the slope of the voltage at and above $V_O''$ in the characteristic shown in FIG. 23 is made negative, thereby to intensify the aspect of the device protection of the circuit in FIG. 24.

With this circuit, the breakdown due to the external application of a high voltage is perfectly prevented, and the power consumption in the integrated circuit does not exceed an allowable value. Thus, even when the instantaneous high voltage has been externally applied, the prevention of the breakdown of the devices is ensured.

Thus far, the voltage converters and their characteristics have been described. Next, the method of feeding the voltage converter with power will be described.

In the above, the gate voltage of $Q_O$ has been presumed to be $V_{CC} + V_{th}$. This has intended to simplify the computation and to clearly elucidate the characteristics of the circuits. Essentially, however, this voltage need not be limited to $V_{CC} + V_{th}$, but may be chosen at will for the convenience of design.

Figure 29A:
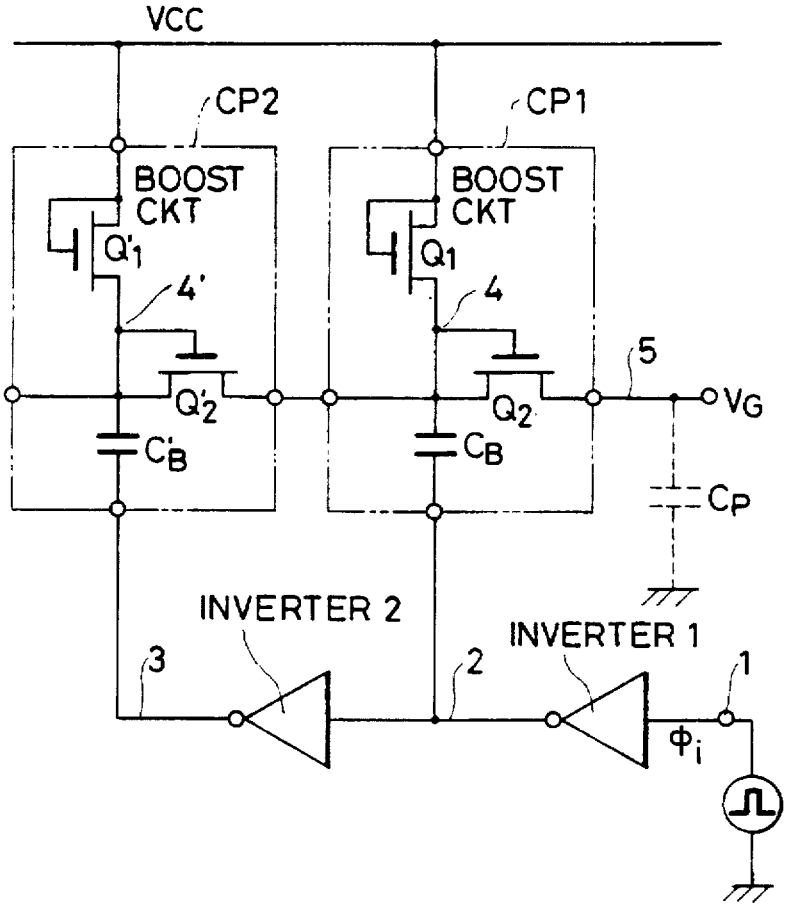
FIG. 29(A) shows a gate signal generator for use in an embodiment of the present invention.
Figure 29B:
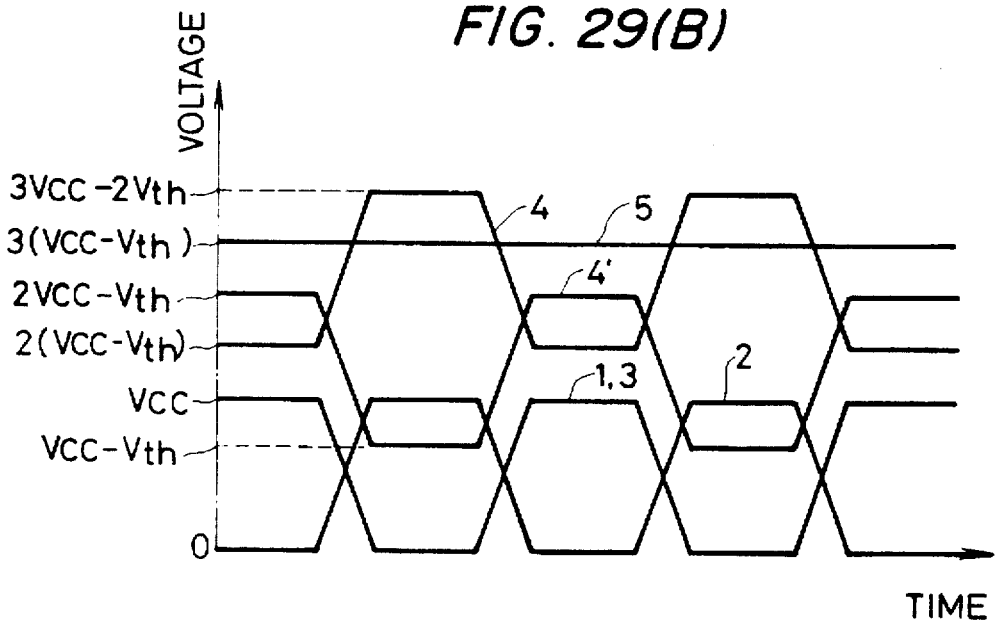
FIG. 29(B) shows a time chart of the circuit in FIG. 29(A).

FIG. 29(A) shows a practicable circuit which boosts the gate voltage $V_G$ to above the supply voltage $V_{CC}$ within the chip as stated with reference to FIG. 15.

When a pulse $\phi_i$ of amplitude $V_{CC}$ from an oscillator OSC included within the chip rises from 0 (zero) V to $V_{CC}$, a node 4' having been previously charged to $V_{CC}-V_{th}$ by $Q_1$' is boosted to 2 $V_{CC}-V_{th}$.

In consequence, a node 4 becomes a voltage 2 ($V_{CC}-V_{th}$) lowered by $V_{th}$ by means of $Q_2$'. Subsequently, when $\phi_i$ becomes 0 V and a node 2 rises to $V_{CC}$, the node 4 is further boosted into 3 $V_{CC}-2$ $V_{th}$. Accordingly, a node 5 becomes a voltage 3 ($V_{CC}-V_{th}$) lowered by $V_{th}$ by means of $Q_2$. Each of $Q_2$' and $Q_2$ is a kind of diode, so that when such cycles are continued a large number of times, $V_G$ becomes a D.C. voltage of 3 ($V_{CC}-V_{th}$). $V_G$ of higher voltage is produced by connecting the circuits CP1, CP2 in a larger number of stages. The reason why the two stages are comprised here, is as follows. Assuming $V_{CC}$ to lower to 2.5 V and $V_{th}$ to be 1 (one) V, one stage affords $V_G$=2 ($V_{CC}-V_{th}$), and hence, $V_G$=3 V holds. Under this condition, however, the source voltage $V_L$ of $Q_O$ in FIG. 15 becomes 2 V lower than $V_{CC}$. In contrast, when the two stages are disposed, $V_G$=4.5 V holds because of $V_G$=3 ($V_{CC}-V_{th}$). Accordingly, $V_L$ can be equalized to $V_{CC}$, so that $V_L$=$V_{CC}$ can be established below $V_O$ as in FIG. 15. Conversely, however, as $V_{CC}$ becomes a higher voltage, it is more of a concern that $V_G$ may become an excess voltage which can break down the associated transistors. Therefore, some circuit for limiting $V_G$ is required on the high voltage side of $V_{CC}$.

Figure 30:
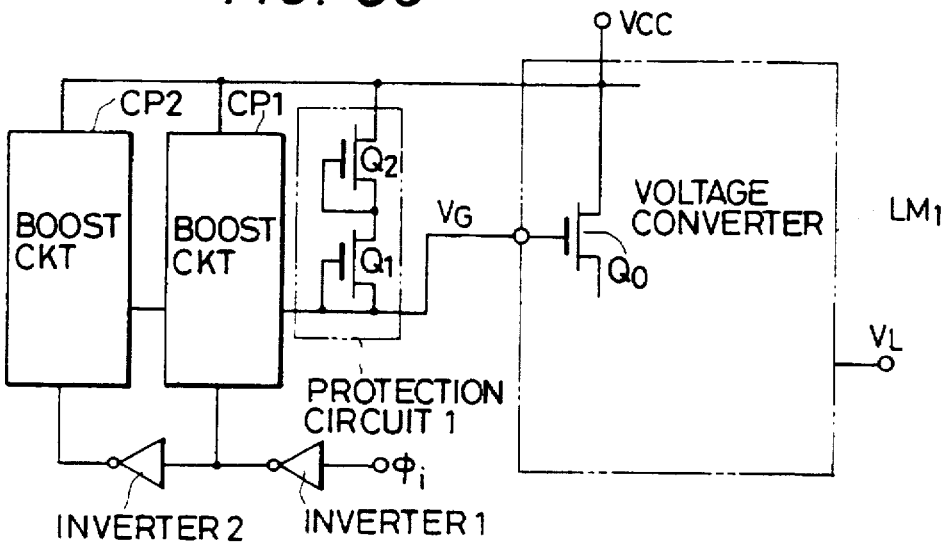
FIG. 30 shows a protection circuit which connects the circuit of FIG. 29(A) with the circuit of FIG. 16, 18, 20, 22, 24, or 26.

FIG. 30 shows an example in which $V_G$≃3 ($V_{CC}-V_{th}$) is held as a high voltage on the low voltage side of $V_{CC}$, and besides, $V_{CC}$+2 $V_{th}$ is held on the high voltage side of $V_{CC}$ in order to protect the associated transistors. Here, any of the circuits thus far described, for example, the whole circuit in FIG. 16, 18, 20, 22, 24 or 26, is indicated by LM1 as the load of $V_G$. A protection circuit CL1 is such that, when $V_G$ is going to exceed $V_{CC}$+2 $V_{th}$, current flows through $Q_1$ and $Q_2$, so $V_G$ results in being fixed to $V_{CC}$+2 $V_{th}$. With the present circuit, $V_{CC}$ at which CL1 operates ranges from 3 ($V_{CC}-V_{th}$)=$V_{CC}$+2 $V_{th}$ to $V_{CC}$=5/2 $V_{th}$.

Figure 31:
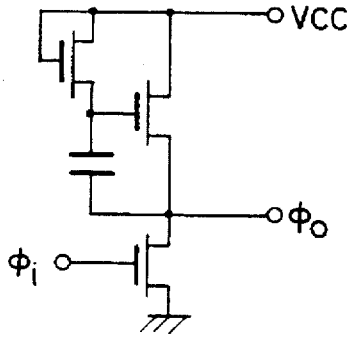
FIG. 31 shows a practicable circuit of an inverter for use in the circuit of FIG. 29(A).

FIG. 31 shows a practicable circuit of the inverter 1 or 2 in FIG. 29(A). An output pulse $\phi_O$ is impressed on the circuit CP1 or CP2.

Figure 32:
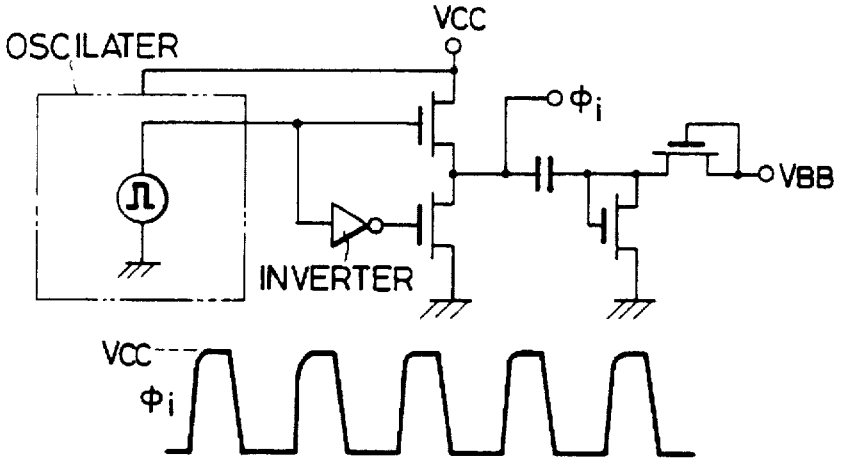
FIG. 32 shows a practicable circuit of an oscillator for use in the circuit of FIG. 29(A).

While the oscillator OSC can be constructed as a circuit built in the chip, FIG. 32 shows an example utilizing a back bias generator which is built in the chip in order to apply a back bias voltage $V_{BB}$ to a silicon substrate. The advantage of this example is that the oscillator need not be designed anew, which is effective for reducing the area of the chip. In general, when $V_L$ is applied to respective transistors with $V_{BB}$ being 0 (zero) V, the threshold voltages $V_{th}$ of the respective transistors are not normal values. Therefore, an excess current flows, or stress conditions on the transistors become severe, so the transistors can break down. In contrast, when this circuit is used, $V_{BB}$ is generated upon closure of a power source, and $V_L$ is generated substantially simultaneously, so that the operations of respective transistors are normally executed.

Figure 33:
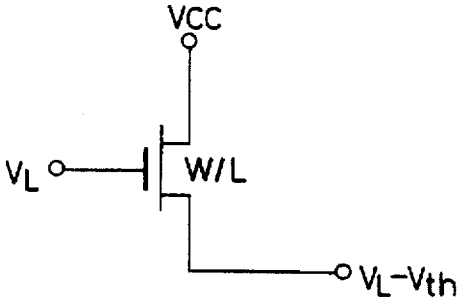
FIG. 33 shows an example of a buffer circuit for the output of the circuit shown in FIG. 16, 18, 20, 22, 24 or 26.
Figure 34:
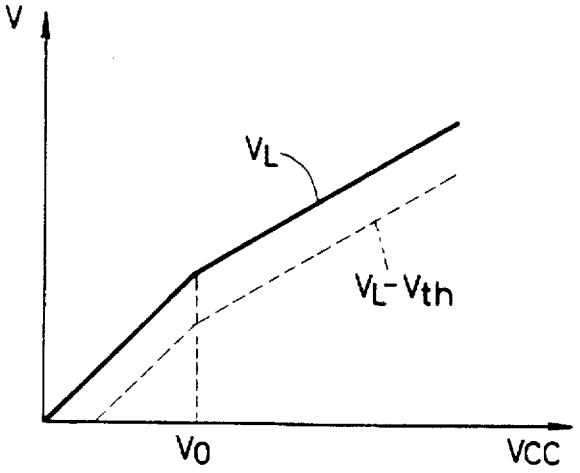
FIG. 34 shows the characteristics of the circuit in FIG. 33.
Figure 35:
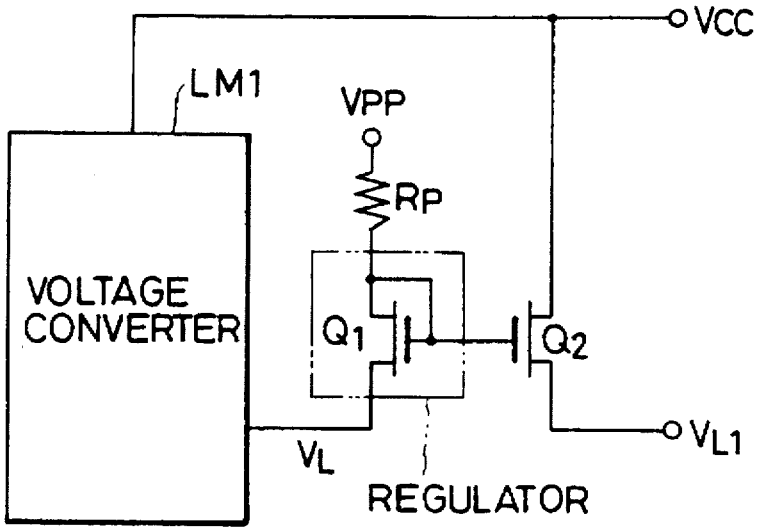
FIGS. 35, 36 and 37 show other examples of buffer circuits, respectively.

Next, practicable embodiments of buffer circuits will be described. As the load of the voltage converter, there is sometimes disposed a load of large capacity or of great load fluctuation. In this case, such a heavy load needs to be driven through a buffer circuit of high driving ability. In order to accomplish this, the ordinary method is to drive the load through a single transistor of high driving ability, namely, a transistor having a large width-to-length ratio W/L as shown in FIG. 33. With this method, however, the performance degrades because a voltage drop of $V_{th}$ arises on the low voltage side of $V_{CC}$ as shown in FIG. 34. FIG. 35 shows a practicable example of the buffer circuit which has a high driving ability without the $V_{th}$ drop. When a voltage $V_{PP}$ is made greater than $V_L$=$V_{th}$ and a resistance $R_P$ is made much higher than the equivalent "on" resistance of a transistor $Q_1$, the gate voltage of a transistor $Q_2$ becomes $V_L$+$V_{th}$. Accordingly, the source voltage $V_{L1}$ of $Q_2$ equalizes to $V_L$. When the W/L of $Q_2$ is made great, the desired buffer circuit is provided. Here, $V_L$ becomes $V_{CC}$ on the low voltage side of $V_{CC}$, so that $V_{PP}$ must be at least $V_{CC}-V_{th}$. As a circuit therefor, the circuit shown in FIG. 29(A) is usable. Regarding connection, the node 5 of the circuit in FIG. 29(A) may be connected to the drain of $Q_1$ in a regulator in FIG. 35. Here, in order that the effective output impedance as viewed from the node 5 may be made sufficiently higher than the equivalent "on" resistance of $Q_1$ of the circuit in FIG. 35, the value of the W/L of $Q_2$ or the value of $C_B$ in FIG. 29(A) or the oscillation frequency of OSC may be properly adjusted by way of example.

Figure 36:
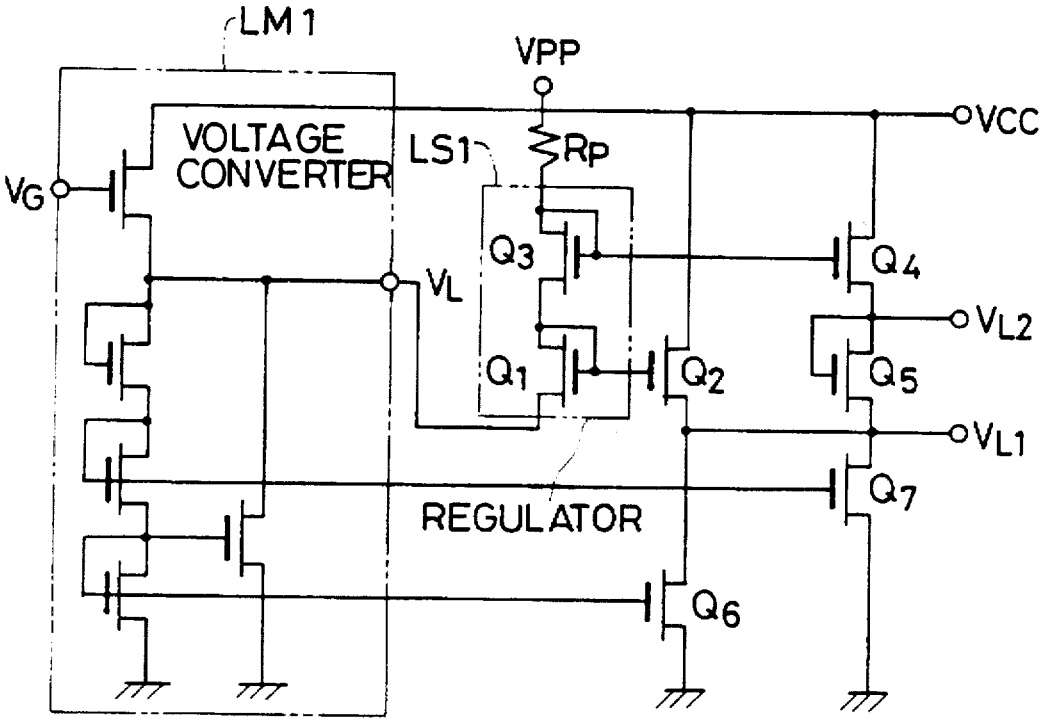

As to some loads, it is necessary to apply $V_L$ to the drain of a transistor constituting a part of the load and to apply $V_L$+$V_{th}$ to the gate thereof, so as to prevent the $V_{th}$ drop and to achieve a high speed operation. FIG. 36 shows an embodiment therefor. The circuit $LM_1$ is, for example, the circuit in FIG. 16, and the voltage $V_{L1}$ equalizes to $V_L$ as stated before. In addition, the gate voltage of $Q_4$ is $V_L$+2 $V_{th}$. Therefore, $V_{L2}$ becomes $V_L$+$V_{th}$. Here, transistors $Q_6$ and $Q_7$ serve to prevent unnecessary charges from remaining in $V_{L1}$ at the transient fluctuation of $V_{CC}$. $Q_6$ and $Q_7$ are connected into LM1 as shown in figure so as to operate at $V_{CC}$ of at least $V_O$ and at $V_{CC}$ of at least $V_O-V_{th}$. Here, the ratio V/L of $Q_6$, $Q_7$ is selected to be sufficiently smaller than that of $Q_2$, minimize the influence of the addition of $Q_6$, $Q_7$ on $V_L$. It has been previously stated that $Q_7$ operates in the region not greater than $V_O$. Since $Q_2$ and $Q_4$ are in the operating states of unsaturated regions ($V_{GS}-V_{th}$≧$V_{DS}$, $V_{GS}$: gate-source voltage, $V_{DS}$: drain-source voltage) in the region not greater than $V_O$, surplus charges are discharged to $V_{CC}$ through $Q_2$, $Q_4$, and hence, $Q_7$ is unnecessary in principle. However, when $V_{CC}$ is near $V_O$, the "on" resistances of $Q_2$, $Q_4$ increase unnecessarily, and it is sometimes impossible to expect the effects of these transistors. Accordingly, $Q_7$ is added, whereby stable values of $V_{L1}$ can be obtained in a wide range from the region ($V_O-V_{th}$) where $V_{CC}$ is not greater than $V_O$, to the region where $V_{CC}$ is greater than $V_O$ and where the converter is normally operating.

The function of $Q_5$ is that, when $V_{L1}$ is going to fluctuate negatively relative to $V_{L2}$, current flows to $Q_5$ so as to keep the difference of $V_{L2}$ and $V_{L1}$ constant. In addition, in the present embodiment, the example of $V_L$ and $V_L$+$V_{th}$ has been stated. However, when the pairs of $Q_1$, $Q_2$ or the pairs of $Q_3$, $Q_4$ are connected in cascade, a voltage whose difference from $V_{L1}$ becomes an integral multiple of $V_{th}$ can be generated.

Figure 37:
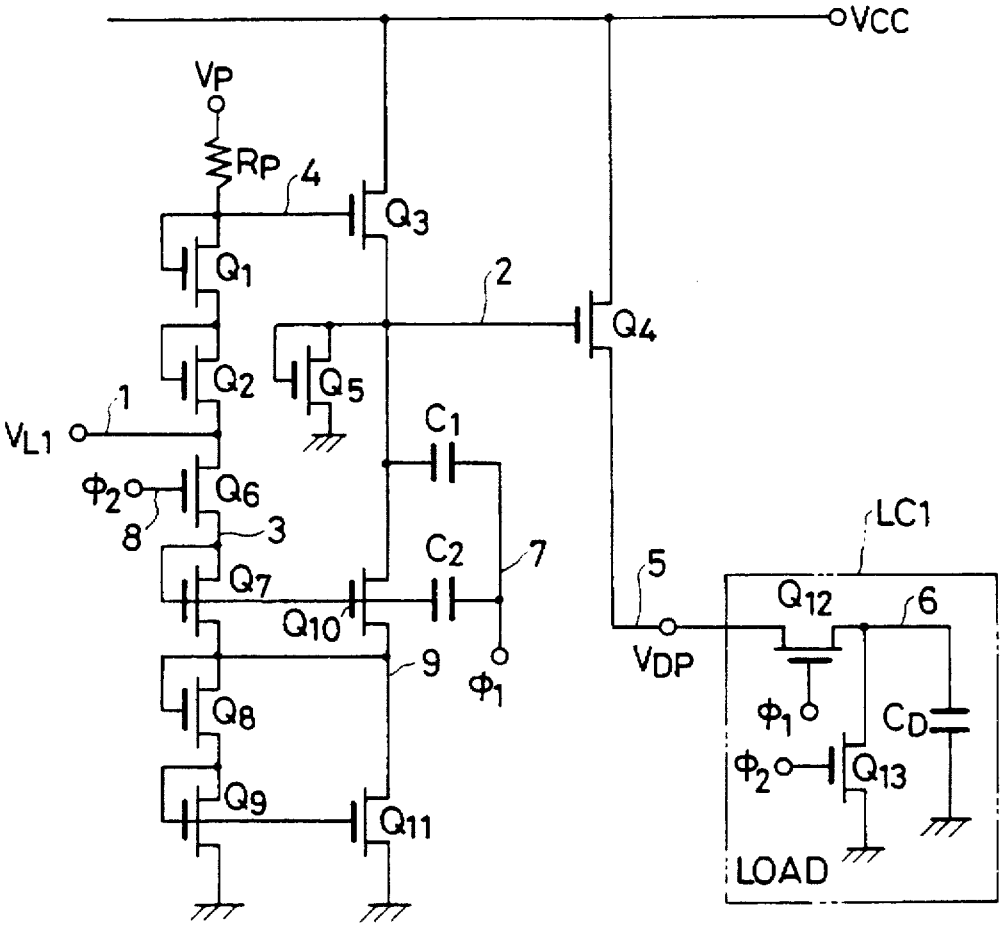
Figure 38:
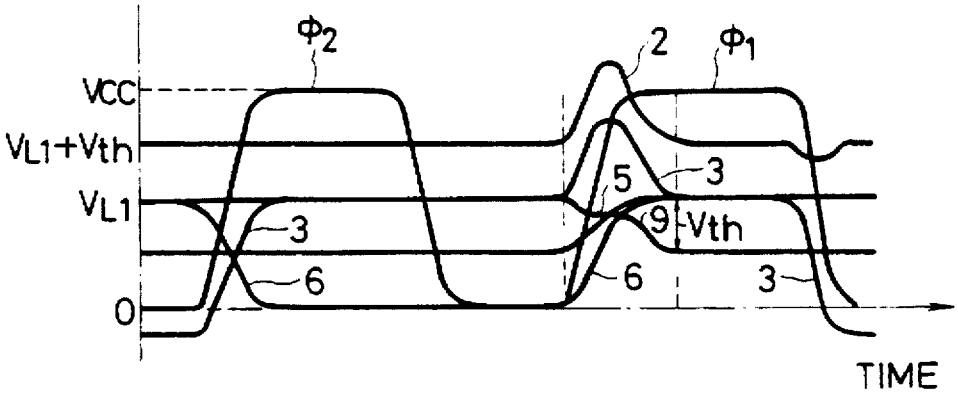
FIG. 38 shows a time chart of the circuit in FIG. 37.

A circuit shown in FIG. 37 is another buffer circuit which is connected to the output stage of the circuit of FIG. 35 or 36 in order to further enhance the driving ability of the buffer circuit of FIG. 35 or 36. By connecting such a buffer circuit of higher driving ability, a large load capacity can be driven. First, $V_{L1}$ becomes $V_{L1}$+2 $V_{th}$ and $V_{L1}$+$V_{th}$ at respective nodes 4 and 2. Eventually, however, it is brought into $V_{DP}$ being the level of $V_{L1}$ at a node 5 by $Q_4$. Problematic here is the load driving ability of $Q_4$ which serves to charge a large capacitance $C_D$ in the load LC1 at high speed. In order to enhance the ability, the node 2 being the gate of $Q_4$ needs to be boosted in a time zone for charging the load. Transistors therefor are $Q_6$–$Q_{11}$, and capacitors are $C_1$ and $C_2$. A node 6 discharged by $Q_{13}$ owing to the "on" state of $\phi_2$ is charged by $Q_{12}$ and $Q_4$ when the next $\phi_1$ is in the "on" state. At this time, the node 2 being at $V_{L1}+V_{th}$ and a node 3 being at $V_{L1}$ are boosted by the "on" state of $\phi_1$. Consequently, the conductances of $Q_{10}$, $Q_{11}$ increase, so that the boosted voltage of the node 2 is discharged to the level of $V_{L1}+V_{th}$ by $Q_{10}$, $Q_{11}$. Here, when the boosting time is made longer than the charging time of $C_D$ based on $Q_4$, $Q_{12}$, the capacitor $C_D$ is charged rapidly. The transistor $Q_6$ cuts off the nodes 3 and 1 when the node 3 is boosted by $\phi_1$. When $\phi_2$ is "on", $Q_7$–$Q_9$ turn "off" subject to the condition of $V_{L1} \leqq 3V_{th}$, so that $Q_{11}$ has its gate rendered below $V_{th}$ to turn "off". Accordingly, no current flows through $Q_3$, $Q_{10}$ and $Q_{11}$, so that the power consumption can be rendered low. In addition, in order to reduce to power consumption in the case of $V_{L1}>3\ V_{th}$, the "on" resistance of $Q_6$ may be increased to lower current. The voltage of the node 3 at this time becomes a stable value of approximately 3 $V_{th}$. Thus, the boosting characteristic of the node 3 is also stabilized, with the result that the operation of the whole circuit can be stabilized.

Here, since the sources and gates of $Q_7$ and $Q_{10}$ are connected in common, the conditions of biasing the gates are quite equal. Accordingly, when $$\frac{\text{capacitance of node 2}}{(W/L)\ Q_7} = \frac{\text{capacitance of node 3}}{(W/L)\ Q_{10}}$$

is held in advance, the boosting characteristics of the nodes 2, 3 can be quite equal, so the circuit design can be facilitated advantageously. That is, one merit of the present embodiment consists in that the boosting characteristic of the node 2 can be automatically controlled with the boosting characteristic of the node 3. In this way, the D.C. path from the node 2 to $V_{SS}$ in the case of performing no boosting can be relieved, and it becomes possible to lower the power consumption.

Here, $Q_5$ has the function of discharging the surplus charges of the node 2 when $Q_{10}$ is "off".

As regards the embodiment of FIG. 37, various modifications can be considered. While the drain of $Q_6$ in FIG. 37 is connected to $V_{L1}$ in order to stabilize the boosting characteristics of the nodes 2, 3 to the utmost, it can also be connected to $V_{CC}$ so as to relieve a burden on $V_{L1}$. Likewise, while $Q_{10}$ subject to the same operating condition as that of $Q_7$ is disposed in order to stabilize the boosting characteristics of the nodes 2, 3, it may well be removed into an arrangement in which the nodes 2 and 9 are directly connected, with the source of $Q_7$ and the node 9/disconnected. Since, in this case, the relationship of $Q_9$ and $Q_{11}$ is in the aforementioned relationship of $Q_7$ and $Q_{10}$, the boosting characteristics can be similarly designed, and the occupying area of the circuit can be effectively reduced. Further, the 3-stage connection arrangement of $Q_7$, $Q_8$ and $Q_9$ is employed here. This is a consideration for efficiently forming the circuit in a small area by utilizing a capacitance Chd 2 (for example, the capacitance between the gate of a MOST and an inversion layer formed between the source and drain thereof, known from ISSCC 72 Dig. of Tech. Papers, p. 14, etc.) for the reduction of the power consumption described above. That is, in order to use the inversion layer capacitance, the gate voltage to be applied needs to be higher by at least $V_{th}$ than the source and drain. Accordingly, in case of forming $C_2$ by the use of a MOST of low $V_{th}$ or an ordinary capacitor, it is also possible to reduce the connection number of $Q_7$–$Q_9$ to two or one.

The buffer circuit as shown in FIG. 37 is indispensable especially to the LSI systems as shown in FIGS. 1 and 2. In general, the voltage converter for generating $V_L$ in FIG. 1 or 2 is desired to have an especially high ability of supplying current because the circuit current in the circuit A, A' or B flows toward the ground. Accordingly, when the whole circuit including the circuit of FIG. 37 thus far described is regarded as the voltage converter of FIG. 1 or 2, it is applicable to general LSIs.

With the embodiments stated above, when the actual circuit of FIG. 18 which is diode-connected as shown in FIG. 27 is operated at $V_{CC}$ of or above $V_O$ as shown in FIG. 17, current flows through $Q_1'$–$Q_S'$ (FIG. 27) to increase the power consumption. This increase of the power consumption poses a problem in case of intending to back up the LIS power source, namely, the externally applied supply voltage with a battery. More specifically, in an apparatus wherein the ordinary external power source is backed up by a battery when turned "off"; when the power consumption of the LSI itself is high, the period of time for which the power source is backed up is limited because the current capacity of the battery is small. Therefore, with a measure wherein $V_{CC}$ to be applied by the battery is set at below $V_O$ during the time interval during which the battery is operated for backup, no current flows through $Q_1'$–$Q_S'$, and hence, the period of time for which the power source can be backed up can be extended to that extent. Alternatively, the number of stages of $Q_1'$–$Q_S'$ (FIG. 27) can be determined so as to establish $V_O$ which is greater than $V_{CC}$ being the battery supply voltage in the case of the backup.

The supply voltage $V_{CC}$ in the ordinary operation can be selected at $V_{CC}<V_O$ besides at $V_{CC}>V_O$. Since this permits no current to flow through $Q_1'$–$Q_S'$ under the ordinary $V_{CC}$ condition, the power consumption can be lowered. Another merit is that design is facilitated because the circuit can be designed while avoiding a region where the relation of $V_{CC}$ and $V_L$ becomes a polygonal line. More specifically, when the polygonal region is used, an imbalance of characteristics concerning $V_{CC}$ arises between a circuit directly employing $V_{CC}$ and a part of a certain circuit employing $V_L$ by way of example, so that the operation sometimes becomes unstable. When $V_{CC}<V_O$ holds, this drawback can be eliminated.

Figure 39:
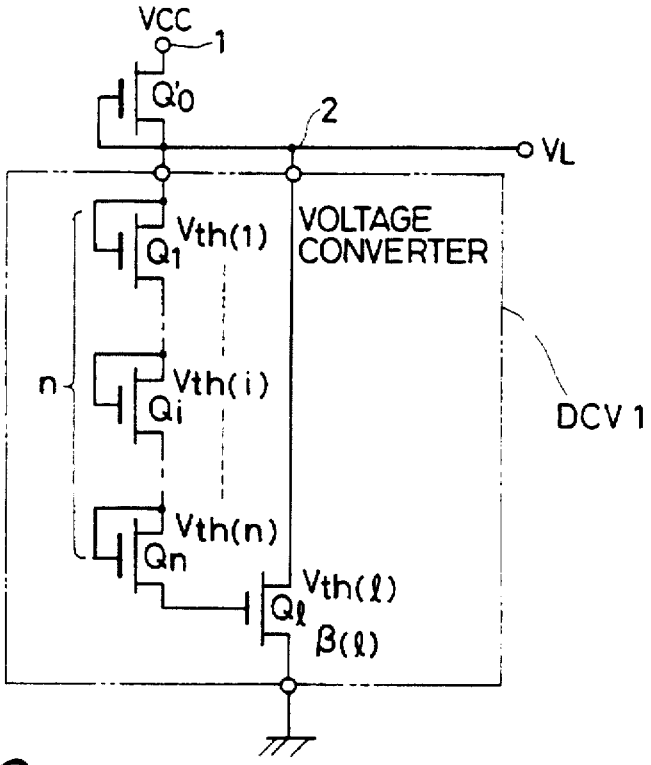
FIG. 39 shows a practicable example of the circuit in FIG. 3.

In the above, the practicable embodiments have been described in which the voltage converters are constructed of MOS transistors. These are examples which chiefly employ MOS transistors of positive threshold voltages $V_{th}$, namely, of the enhancement mode. Needless to say, however, it is also possible to employ a MOS transistor of negative $V_{th}$, namely, of the depletion mode as disclosed in FIG. 16 of Japanese Patent Application No. 56–168,698. For example, in the embodiment of FIG. 16, in order to establish $V_L=V_{CC}$ in the region of $V_{CC} \leqq V_O$ as illustrated in the characteristic of FIG. 15, the gate voltage of $Q_O$ needs to be $V_G \geqq V_{CC}+V_{th(O)}$, and it has been stated that the circuit of FIG. 29(A) may be used as the $V_G$ generator therefor. In this regard, the circuit can be further simplified by employing the MOS transistor of the depletion mode. FIG. 39 shows such a practicable embodiment. It differs from the circuit of FIG. 16 in that $Q_O$ is replaced with the depletion mode MOS transistor $Q_O'$, the gate of which is connected to the terminal 2. With this measure, since the $V'_{th(O)}$ of $Q_O'$ is negative, $Q_O'$ is in the "on" state at all times, and the desired characteristic illustrated in FIG. 15 can be realized without employing the $V_G$ generator as shown in FIG. 29(A). With the present embodiment, not only the circuit arrangement can be simplified as stated above, but also the merit of attaining a stable characteristic is achieved because current $I(Q_O')$ to flow through $Q_O'$ becomes a constant current determined by $\beta'(O)$ (channel conductance) and $V'_{th(O)}$ (threshold voltage) as $$I(Q_0') = \frac{\beta'(0)}{2} \cdot V'^2_{th(0)}.$$

Although the present embodiment has exemplified FIG. 16, it is applicable as it is by substituting $Q_O'$ for $Q_O$ in any other embodiment and connecting its gate to the terminal 2 as in the present embodiment.

Figure 40:
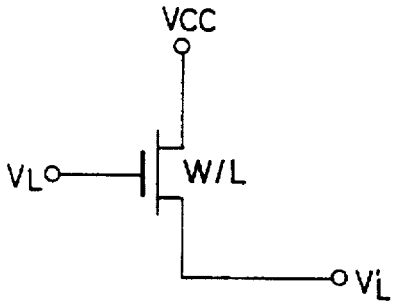
FIG. 40 shows an example of a buffer circuit.
Figure 41:
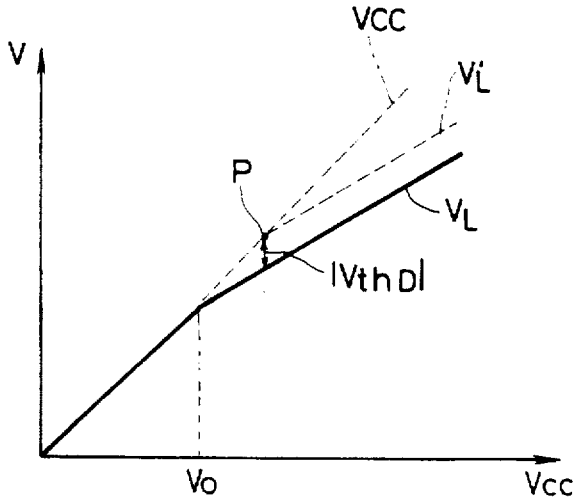
FIG. 41 shows the characteristics of the circuit in FIG. 40.

FIG. 40 shows an embodiment in which a buffer circuit is constructed using a single depletion-mode MOS transistor, while FIG. 41 shows the characteristic thereof. Although the present embodiment is the same in the circuit arrangement as the foregoing embodiment of FIG. 33, it differs in that the MOS transistor is changed from the enhancement mode into the depletion mode. As shown in FIG. 41, the output $V_L$ of the present buffer circuit bends from a point P at which the difference of $V_{CC}$ and $V_L$ equalizes to the absolute value $|V_{thD}|$ of the threshold voltage $V_{thD}$ of the MOS transistor, and it thereafter becomes a voltage which is higher than $V_L$ by $|V_{thD}|$. Accordingly, $V_L$ may be set lower than a desired value by $|V_{thD}|$. The present embodiment has a simple circuit arrangement, and can meritoriously eliminate the problem, as in the characteristic of the embodiment of FIG. 33 illustrated in FIG. 34, that only the output lower than $V_{CC}$ by $V_{th}$ can be produced in the range of $V_{CC} \leqq V_O$.

As set forth above, the present invention can provide, in an integrated circuit having small geometry devices, an integrated circuit which has a wide operating margin even against the fluctuations of an external supply voltage in an ordinary operation and which can apply a sufficient aging voltage.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A semiconductor integrated circuit contained within a chip having a regulated voltage comprising:

circuit means contained within the semiconductor integrated circuit which has an input to which is coupled the regulated voltage for powering said circuit means;

means for producing the regulated voltage having an input adapted to be coupled to a means for supplying an external supply voltage, and an output which is coupled to the input of the circuit means *to which* the regulated voltage is applied, the regulated voltage being a function of the external supply voltage whose rate of change with respect to change in the external supply voltage is not constant when external supply voltage is changed from a value thereof in a predetermined ordinary operation range of the semiconductor integrated circuit to a different value within a range for performing an aging test on said semiconductor integrated circuit, said means for producing the regulated voltage comprising a first transistor having an input terminal to which a reference voltage is applied from a reference voltage generator producing a reference voltage and an output which is the regulated voltage, the output also being applied to a second transistor coupled to a reference potential which applies a negative feedback to at least one additional transistor coupled between the output of the first transistor and the second transistor; and the regulated voltage provided during the aging test approximately equalizing stress conditions of transistors of small geometries receiving the regulated voltage to stress conditions of transistors of large geometries receiving the external voltage.

2. A semiconductor integrated circuit according to claim 1, wherein the rate of change of the output voltage of said means for producing the regulated voltage is less when said external supply voltage changes within the ordinary operation range than the rate of change of the output voltage when the external supply voltage changes within the range for performing said aging test.

3. A semiconductor integrated circuit according to claim 1, wherein the change of the output voltage of said means for producing the regulated voltage follows the change of said external supply voltage when said external supply voltage changes within the ordinary operation range.

4. A semiconductor integrated circuit according to claim 1, 2 or 3, wherein said means for producing the regulated voltage changes its output voltage so as to reach unequal aging voltages in succession in accordance with the change of said external supply voltage.

5. A semiconductor integrated circuit according to claim 1, 2 or 3, wherein said means for producing the regulated voltage includes means to prevent its output voltage from exceeding a breakdown voltage of the internal circuit when said output voltage of said means for producing the regulated voltage has exceeded a predetermined aging voltage.

6. A semiconductor integrated circuit according to claim 5, wherein said means for producing the regulated voltage includes means to negatively change its output voltage in correspondence with a rise of said external supply voltage when said output voltage of said means for producing the regulated [means] *voltage* has exceeded the predetermined aging voltage.

7. A semiconductor integrated circuit according to claim 5, wherein said means for producing the regulated voltage includes means to prevent its output voltage from exceeding a breakdown voltage of the circuit means when said output voltage of said means for producing the regulated voltage has exceeded a predetermined aging voltage.

8. A semiconductor integrated circuit according to claim 5, wherein said means for producing the regulated voltage includes means to negatively change its output voltage in correspondence with a rise of said external supply voltage when said output voltage of said means for producing the regulated voltage has exceeded the predetermined aging voltage.

9. A semiconductor integrated circuit in accordance with claim 1 wherein:

the reference voltage [producted] *produced* by the reference voltage generator is zero when operation of the circuit means is in the ordinary range and increases in a step function from a first potential of zero to a first level at a lowest voltage of operation of the aging test and [increase] *increases* during higher potentials of the external voltage during the conducting of the aging test.

10. A semiconductor integrated circuit in accordance with claim 9 wherein:

the first transistor is a FET having a gate coupled to the reference voltage, one of a source and a drain is coupled to a reference potential and the other of the source and drain is the output;

the second transistor is a FET having one of a source or drain coupled to the output and the other of the source and drain is coupled to a reference potential; and each additional transistor having a gate coupled to one of a source and drain with the source and drain of each of the one or more additional transistors being coupled in a series circuit coupled between the output of the first transistor and a gate of the first transistor.

11. A semiconductor integrated circuit in accordance with claim 1 wherein:

the regulated voltage varies as a linear function of the external supply voltage during a predetermined ordinary operation range.

12. A semiconductor integrated circuit in accordance with claim 11 wherein:

the regulated voltage in the range for performing an aging test has a slope for changes in the external supply voltage which is less than a slope for changes in the external supply voltage in the range of ordinary operation.

13. A semiconductor integrated circuit comprising:

an input terminal for receiving an external supply voltage; and means coupled to said input terminal for lowering said supply voltage to provide an output voltage at a reduced power supply terminal for providing power at a reduced voltage level to at least one predetermined circuit coupled to said reduced power supply terminal, said lowering means comprising:

means for providing a first output voltage signal which is a function of the external supply voltage and having a first predetermined rate of change with respect to change in the external supply voltage for change in said supply voltage from a first predetermined supply voltage greater than zero to a second predetermined supply voltage with the first and second predetermined voltages defining a first range for operating the circuit in a predetermined ordinary operating range;

means for providing a second output voltage signal which is a function of the external supply voltage and having a second predetermined rate of change different than that of said first predetermined rate of change with respect to change in the external supply voltage for change in said supply voltage from said second predetermined supply voltage to a third predetermined supply voltage greater than said second predetermined supply voltage with the second and third predetermined voltages defining a second range for performing an aging test on the circuit;

means for providing a third output voltage signal which is a function of the external supply voltage and having a third predetermined rate of change different than that of said second predetermined rate of change with respect to change in the external supply voltage for change in said supply voltage from said third predetermined supply voltage to a fourth predetermined supply voltage greater than said third predetermined supply voltage with the third and fourth predetermined voltages defining a third range for performing an aging test on the circuit; and said second or third output voltage signals provided during the aging test approximately equalizing stress conditions of transistors of small geometries receiving said second or third output voltage signal to stress conditions of transistors of large geometries receiving said external supply voltage.

14. A semiconductor integrated circuit according to claim 13, wherein said first predetermined supply voltage is zero.

15. A semiconductor integrated circuit according to claim 13, wherein said second and third rates of change are positive, and said second rate of change is less than said third rate of change.

16. A semiconductor integrated circuit according to claim 13, wherein said second rate of change is positive and said third rate of change is negative.

17. A semiconductor integrated circuit according to claim 13, wherein said second rate of change is zero and said third rate of change is positive.

18. A semiconductor integrated circuit according to claim 13, wherein said second rate of change is zero and said third rate of change is negative.

19. A semiconductor integrated circuit according to claim 13, wherein said lowering means further comprises means for providing a fourth output voltage signal which is a function of the external supply voltage and having a fourth predetermined rate of change different from that of said third predetermined rate of change with respect to change in the external supply voltage for change in said supply voltage between said fourth predetermined supply voltage and a fifth predetermined supply voltage greater than said fourth predetermined supply voltage with the fourth and fifth predetermined voltages defining a fourth range for performing an aging test on the circuit.

20. A semiconductor integrated circuit according to claim 19, wherein said second, third and fourth rates of change are positive, and wherein said second rate of change is less than said third rate of change and said third rate of change is less than said fourth rate of change.

21. A semiconductor integrated device according to claim 19, wherein said second, third and fourth rates of change are positive, and wherein said second rate of change is greater than said third rate of change and said third rate of change is greater then said fourth rate of change.

22. A semiconductor integrated circuit according to claim 19, wherein said second rate of change is zero, and said third and fourth rates of change are positive, with said third rate of change being greater than said fourth rate of change.

23. A semiconductor integrated circuit according to claim 19, wherein said second rate of change is zero and said third and fourth rates of change are positive, with said third rate of change being less than said fourth rate of change.

24. A semiconductor integrated circuit contained within a chip having a regulated voltage comprising:

circuit means contained within the semiconductor integrated circuit which has an input to which is coupled the regulated voltage for powering said circuit means; and means for producing the regulated voltage having an input adapted to be coupled to a means for supplying an external supply voltage, and an output which is coupled to the input of the circuit means to which the regulated voltage is applied, the regulated voltage being a function of the external supply voltage whose rate of change with respect to change in the external supply voltage is not constant when said external supply voltage is changed from a value thereof in a predetermined ordinary operation range of the semiconductor integrated circuit to a higher value within a range for performing an aging test on said semiconductor integrated circuit, the regulated voltage provided during the aging test approximately equalizing *stress* conditions of transistors of small geometries receiving the regulated voltage to stress conditions of transistors of large geometries receiving the external supply voltage, the means for producing the regulated voltage comprising a reference voltage generator coupled to the external supply voltage for producing a control voltage which varies as a function of the external supply voltage and a transistor having a current conduction path coupled between the external supply voltage and a reference potential and a control terminal to which is applied the control voltage, the output being coupled to the current conduction path at a point remote from the reference potential.

25. A semiconductor integrated circuit within a chip having a regulated voltage in accordance with claim 24, wherein the means for producing a regulated voltage produces a rate of change during normal operation and the conducting of an aging test which is not constant.

26. A semiconductor integrated circuit contained within a chip having a regulated voltage comprising:

circuit means contained within the semiconductor integrated circuit which has an input to which is coupled the regulated voltage for powering said circuit means; and means for producing the regulated voltage having an input adapted to be coupled to a means for supplying an external supply voltage, and an output which is coupled to the input of the circuit means to which the regulated voltage is supplied, the regulated voltage being a function of the external supply voltage whose rate of change with respect to change in the external supply voltage has a first rate of change between an external voltage varying between 0 volts and a first predetermined magnitude and a second non-constant rate of change from the first predetermined magnitude to a greater magnitude, the second non-constant rate of change including a predetermined ordinary operation range for the circuit means and a higher range for conducting an aging test, the rate of change for the ordinary operation range being different from the rate of change for conducting an aging test, and the rate of increase of the regulated voltage as a function of the external voltage in the range between 0 volts and the first predetermined magnitude being greater than the average rate of increase between the first predetermined magnitude and the greater magnitude of the second non-constant rate of change, the regulated voltage provided during the aging test approximately equalizing stress conditions of transistors of small geometries receiving the regulated voltage to stress conditions of transistors of large geometries receiving the external supply voltage.

27. A semiconductor integrated circuit as in claim 26, wherein the rate of change for the ordinary operation range is less than the rate of change for the conducting of the aging test.

* * * * *